(12) United States Patent
Raring

(10) Patent No.: US 8,969,113 B2
(45) Date of Patent: Mar. 3, 2015

(54) OPTICAL DEVICE STRUCTURE USING GAN SUBSTRATES AND GROWTH STRUCTURES FOR LASER APPLICATIONS

(71) Applicant: Soraa Laser Diode, Inc., Goleta, CA (US)

(72) Inventor: James W. Raring, Fremont, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 0 days.

(21) Appl. No.: 14/229,738

(22) Filed: Mar. 28, 2014

(65) Prior Publication Data

US 2015/0024526 A1 Jan. 22, 2015

Related U.S. Application Data

(60) Division of application No. 13/549,335, filed on Jul. 13, 2012, which is a continuation-in-part of application No. 12/884,993, filed on Sep. 17, 2010, now Pat. No. 8,351,478, said application No. 13/549,335 is a continuation-in-part of application No. 12/778,718, filed on May 12, 2010, now Pat. No. 8,242,522, said application No. 13/549,335 is a continuation-in-part of application No. 12/762,269, (Continued)

(51) Int. Cl.
*H01L 21/00* (2006.01)

(52) U.S. Cl.
USPC .......................... 438/31; 372/44.01

(58) Field of Classification Search
CPC ........ H01S 5/00; H01S 5/0206; H01S 5/0218
USPC ..................... 438/39; 257/E21.211
See application file for complete search history.

(56) References Cited

U.S. PATENT DOCUMENTS

| 4,318,058 | A | 3/1982 | Mito et al. |
| 4,341,592 | A | 7/1982 | Shortes et al. |
| 4,860,687 | A | 8/1989 | Frijlink |
| 4,911,102 | A | 3/1990 | Manabe et al. |
| 5,331,654 | A | 7/1994 | Jewell et al. |
| 5,334,277 | A | 8/1994 | Nakamura |
| 5,366,953 | A | 11/1994 | Char et al. |
| 5,527,417 | A | 6/1996 | Lida et al. |
| 5,607,899 | A | 3/1997 | Yoshida et al. |
| 5,632,812 | A | 5/1997 | Hirabayashi |
| 5,647,945 | A | 7/1997 | Matsuse et al. |
| 5,696,389 | A | 12/1997 | Ishikawa et al. |
| 5,821,555 | A | 10/1998 | Saito et al. |
| 5,888,907 | A | 3/1999 | Tomoyasu et al. |
| 5,926,493 | A | 7/1999 | O'Brien et al. |
| 5,951,923 | A | 9/1999 | Rorie et al. |

(Continued)

FOREIGN PATENT DOCUMENTS

| CN | 101009347 | 3/1987 |
| CN | 1538534 | 10/2004 |

(Continued)

OTHER PUBLICATIONS

Abare "Cleaved and Etched Facet Nitride Laser Diodes," IEEE Journal of Selected Topics in Quantum Electronics, vol. 4, No. 3, pp. 505-509 (May 1998).

(Continued)

*Primary Examiner* — Tuan Nguyen
(74) *Attorney, Agent, or Firm* — Kilpatrick Townsend & Stockton LLP

(57) ABSTRACT

Optical devices having a structured active region configured for selected wavelengths of light emissions are disclosed.

33 Claims, 14 Drawing Sheets

Related U.S. Application Data filed on Apr. 16, 2010, now Pat. No. 8,254,425, said application No. 13/549,335 is a continuation-in-part of application No. 12/762,271, filed on Apr. 16, 2010, now Pat. No. 8,294,179, said application No. 13/549,335 is a continuation-in-part of application No. 12/759,273, filed on Apr. 13, 2010.

(60) Provisional application No. 61/249,568, filed on Oct. 7, 2009, provisional application No. 61/243,502, filed on Sep. 17, 2009, provisional application No. 61/177,317, filed on May 12, 2009, provisional application No. 61/177,218, filed on May 11, 2009, provisional application No. 61/170,550, filed on Apr. 17, 2009, provisional application No. 61/170,553, filed on Apr. 17, 2009, provisional application No. 61/177,227, filed on May 11, 2009, provisional application No. 61/168,926, filed on Apr. 13, 2009.

(56) References Cited

U.S. PATENT DOCUMENTS

| | | | |
|---|---|---|---|
| 6,069,394 A | 5/2000 | Hashimoto et al. |
| 6,072,197 A | 6/2000 | Horino et al. |
| 6,147,953 A | 11/2000 | Duncan |
| 6,153,010 A | 11/2000 | Kiyoku et al. |
| 6,195,381 B1 | 2/2001 | Botez et al. |
| 6,239,454 B1 | 5/2001 | Glew et al. |
| 6,379,985 B1 | 4/2002 | Cervantes et al. |
| 6,451,157 B1 | 9/2002 | Hubacek |
| 6,489,636 B1 | 12/2002 | Goetz et al. |
| 6,586,762 B2 | 7/2003 | Kozaki |
| 6,635,904 B2 | 10/2003 | Goetz et al. |
| 6,639,925 B2 | 10/2003 | Niwa et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,858,882 B2 | 2/2005 | Tsuda et al. |
| 6,920,166 B2 | 7/2005 | Akasaka et al. |
| 7,009,199 B2 | 3/2006 | Hall |
| 7,019,325 B2 | 3/2006 | Li et al. |
| 7,033,858 B2 | 4/2006 | Chai et al. |
| 7,053,413 B2 | 5/2006 | D'Evelyn et al. |
| 7,063,741 B2 | 6/2006 | D'Evelyn |
| 7,128,849 B2 | 10/2006 | Setlur et al. |
| 7,220,324 B2 | 5/2007 | Baker et al. |
| 7,303,630 B2 | 12/2007 | Motoki et al. |
| 7,312,156 B2 | 12/2007 | Granneman et al. |
| 7,323,723 B2 | 1/2008 | Ohtsuka et al. |
| 7,338,828 B2 | 3/2008 | Imer et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,470,555 B2 | 12/2008 | Matsumura |
| 7,483,466 B2 | 1/2009 | Uchida et al. |
| 7,483,468 B2 | 1/2009 | Tanaka |
| 7,489,441 B2 | 2/2009 | Scheible et al. |
| 7,491,984 B2 | 2/2009 | koike et al. |
| 7,555,025 B2 | 6/2009 | Yoshida |
| 7,598,104 B2 | 10/2009 | Teng et al. |
| 7,691,658 B2 | 4/2010 | Kaeding et al. |
| 7,709,284 B2 | 5/2010 | Iza et al. |
| 7,727,332 B2 | 6/2010 | Habel et al. |
| 7,733,571 B1 | 6/2010 | Li |
| 7,749,326 B2 | 7/2010 | Kim et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 7,976,630 B2 | 7/2011 | Poblenz et al. |
| 8,017,932 B2 | 9/2011 | Okamoto et al. |
| 8,044,412 B2 | 10/2011 | Murphy et al. |
| 8,124,996 B2 | 2/2012 | Raring et al. |
| 8,126,024 B1 | 2/2012 | Raring et al. |
| 8,143,148 B1 | 3/2012 | Raring et al. |
| 8,242,522 B1 | 8/2012 | Raring et al. |
| 8,247,887 B1 | 8/2012 | Raring et al. |
| 8,254,425 B1 | 8/2012 | Raring et al. |
| 8,259,769 B1 | 9/2012 | Raring et al. |
| 8,284,810 B1 | 10/2012 | Sharma et al. |
| 8,294,179 B1 | 10/2012 | Raring et al. |
| 8,314,429 B1 | 11/2012 | Raring et al. |
| 8,350,273 B2 | 1/2013 | Vielemeyer |
| 8,351,478 B2 | 1/2013 | Raring |
| 8,355,418 B2 | 1/2013 | Raring et al. |
| 8,416,825 B1 | 4/2013 | Raring et al. |
| 8,422,525 B1 | 4/2013 | Raring et al. |
| 8,427,590 B2 | 4/2013 | Raring et al. |
| 8,451,876 B1 | 5/2013 | Raring et al. |
| 8,634,442 B1 | 1/2014 | Raring et al. |
| 2001/0048114 A1 | 12/2001 | Morita et al. |
| 2002/0027933 A1 | 3/2002 | Tanabe et al. |
| 2002/0050488 A1 | 5/2002 | Nikitin et al. |
| 2002/0085603 A1 | 7/2002 | Okumura |
| 2002/0105986 A1 | 8/2002 | Yamasaki |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0129810 A1 | 7/2003 | Barth |
| 2003/0140846 A1 | 7/2003 | Biwa et al. |
| 2003/0178617 A1 | 9/2003 | Appenzeller et al. |
| 2003/0200931 A1 | 10/2003 | Goodwin |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0099213 A1 | 5/2004 | Adomaitis et al. |
| 2004/0104391 A1 | 6/2004 | Maeda et al. |
| 2004/0151222 A1 | 8/2004 | Sekine |
| 2004/0196877 A1 | 10/2004 | Kawakami et al. |
| 2004/0222357 A1 | 11/2004 | King et al. |
| 2004/0233950 A1 | 11/2004 | Furukawa et al. |
| 2004/0247275 A1 | 12/2004 | Vakhshoori et al. |
| 2004/0262624 A1 | 12/2004 | Akita et al. |
| 2005/0040384 A1 | 2/2005 | Tanaka et al. |
| 2005/0072986 A1 | 4/2005 | Sasaoka |
| 2005/0168564 A1 | 8/2005 | Kawaguchi et al. |
| 2005/0214992 A1 | 9/2005 | Chakraborty et al. |
| 2005/0218413 A1 | 10/2005 | Matsumoto et al. |
| 2005/0224826 A1 | 10/2005 | Keuper et al. |
| 2005/0229855 A1 | 10/2005 | Raaijmakers |
| 2005/0230701 A1 | 10/2005 | Huang |
| 2005/0247260 A1 | 11/2005 | Shin et al. |
| 2005/0285128 A1 | 12/2005 | Scherer et al. |
| 2005/0286591 A1 | 12/2005 | Lee |
| 2006/0030738 A1 | 2/2006 | Vanmaele et al. |
| 2006/0033009 A1 | 2/2006 | Kobayashi et al. |
| 2006/0037529 A1 | 2/2006 | D'Evelyn |
| 2006/0038193 A1 | 2/2006 | Wu et al. |
| 2006/0060131 A1 | 3/2006 | Atanackovic |
| 2006/0066319 A1 | 3/2006 | Dallenbach et al. |
| 2006/0077795 A1 | 4/2006 | Kitahara et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0118799 A1 | 6/2006 | D'Evelyn et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0213429 A1 | 9/2006 | Motoki et al. |
| 2006/0216416 A1 | 9/2006 | Sumakeris et al. |
| 2006/0256482 A1 | 11/2006 | Araki et al. |
| 2006/0288928 A1 | 12/2006 | Eom et al. |

(56) References Cited

U.S. PATENT DOCUMENTS

| | | |
|---|---|---|
| 2007/0081857 A1 | 4/2007 | Yoon |
| 2007/0086916 A1 | 4/2007 | LeBoeuf et al. |
| 2007/0093073 A1 | 4/2007 | Farrell et al. |
| 2007/0101932 A1 | 5/2007 | Schowalter et al. |
| 2007/0110112 A1 | 5/2007 | Sugiura |
| 2007/0120141 A1 | 5/2007 | Moustakas et al. |
| 2007/0153866 A1 | 7/2007 | Shchegrov et al. |
| 2007/0163490 A1 | 7/2007 | Habel et al. |
| 2007/0166853 A1 | 7/2007 | Guenthe et al. |
| 2007/0184637 A1 | 8/2007 | Haskell et al. |
| 2007/0217462 A1 | 9/2007 | Yamasaki |
| 2007/0242716 A1 | 10/2007 | Samal et al. |
| 2007/0252164 A1 | 11/2007 | Zhong et al. |
| 2007/0259464 A1 | 11/2007 | Bour et al. |
| 2007/0272933 A1 | 11/2007 | Kim et al. |
| 2007/0280320 A1 | 12/2007 | Feezell et al. |
| 2008/0029152 A1 | 2/2008 | Milshtein et al. |
| 2008/0087919 A1 | 4/2008 | Tysoe et al. |
| 2008/0092812 A1 | 4/2008 | McDiarmid et al. |
| 2008/0094592 A1* | 4/2008 | Shibazaki ............... 355/53 |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezele et al. |
| 2008/0191223 A1 | 8/2008 | Nakamura et al. |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0232416 A1 | 9/2008 | Okamoto et al. |
| 2008/0251020 A1 | 10/2008 | Franken et al. |
| 2008/0285609 A1* | 11/2008 | Ohta et al. ............ 372/44.011 |
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0021723 A1 | 1/2009 | De Lega |
| 2009/0058532 A1 | 3/2009 | Kikkawa et al. |
| 2009/0061857 A1 | 3/2009 | Kazmi |
| 2009/0066241 A1 | 3/2009 | Yokoyama |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0141765 A1 | 6/2009 | Kohda et al. |
| 2009/0153752 A1 | 6/2009 | Silverstein |
| 2009/0159869 A1 | 6/2009 | Ponce et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0310640 A1 | 12/2009 | Sato et al. |
| 2009/0316116 A1 | 12/2009 | Melville et al. |
| 2009/0320744 A1 | 12/2009 | D'Evelyn |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0006546 A1 | 1/2010 | Young et al. |
| 2010/0006873 A1 | 1/2010 | Raring et al. |
| 2010/0025656 A1 | 2/2010 | Raring et al. |
| 2010/0031875 A1 | 2/2010 | D'Evelyn |
| 2010/0044718 A1 | 2/2010 | Hanser et al. |
| 2010/0096615 A1 | 4/2010 | Okamoto et al. |
| 2010/0104495 A1 | 4/2010 | Kawabata et al. |
| 2010/0140630 A1 | 6/2010 | Hamaguchi et al. |
| 2010/0140745 A1 | 6/2010 | Khan et al. |
| 2010/0151194 A1 | 6/2010 | D'Evelyn |
| 2010/0195687 A1 | 8/2010 | Okamoto et al. |
| 2010/0220262 A1 | 9/2010 | DeMille et al. |
| 2010/0276663 A1 | 11/2010 | Enya et al. |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0031508 A1 | 2/2011 | Hamaguchi et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0073888 A1 | 3/2011 | Ueno et al. |
| 2011/0075694 A1 | 3/2011 | Yoshizumi et al. |
| 2011/0100291 A1 | 5/2011 | D'Evelyn |
| 2011/0103418 A1 | 5/2011 | Hardy et al. |
| 2011/0129669 A1 | 6/2011 | Fujito et al. |
| 2011/0150020 A1 | 6/2011 | Haase et al. |
| 2011/0164637 A1 | 7/2011 | Yoshizumi et al. |
| 2011/0170569 A1 | 7/2011 | Tyagi et al. |
| 2011/0180781 A1 | 7/2011 | Raring et al. |
| 2011/0183498 A1 | 7/2011 | D'Evelyn |
| 2011/0186874 A1 | 8/2011 | Shum |
| 2011/0186887 A1 | 8/2011 | Trottier et al. |
| 2011/0188530 A1 | 8/2011 | Iell |
| 2011/0216795 A1 | 9/2011 | Hsu et al. |
| 2011/0247556 A1 | 10/2011 | Raring et al. |
| 2011/0281422 A1 | 11/2011 | Wang et al. |
| 2011/0286484 A1 | 11/2011 | Raring et al. |
| 2012/0104359 A1 | 5/2012 | Felker et al. |
| 2012/0119218 A1 | 5/2012 | Su |
| 2012/0178198 A1 | 7/2012 | Raring et al. |
| 2012/0187371 A1 | 7/2012 | Raring et al. |
| 2012/0314398 A1 | 12/2012 | Raring et al. |
| 2013/0016750 A1 | 1/2013 | Raring et al. |
| 2013/0022064 A1 | 1/2013 | Raring et al. |
| 2013/0044782 A1 | 2/2013 | Raring |
| 2013/0064261 A1 | 3/2013 | Sharma et al. |

FOREIGN PATENT DOCUMENTS

| | | |
|---|---|---|
| CN | 1702836 | 11/2005 |
| CN | 1781195 | 5/2006 |
| CN | 101079463 | 11/2007 |
| CN | 101099245 | 1/2008 |
| CN | 1171692 | 4/2008 |
| JP | 3-287770 | 12/1991 |
| JP | 2007-173467 | 7/2007 |
| JP | 2007-068398 | 4/2008 |
| JP | 2008-205231 | 9/2008 |
| JP | 2008-300547 | 12/2008 |
| JP | 2008-306062 | 12/2008 |
| JP | 2008-311640 | 12/2008 |
| WO | 2004/084275 | 9/2004 |
| WO | 2008-041521 | 4/2008 |
| WO | 2010/120819 | 10/2010 |

OTHER PUBLICATIONS

Aoki et al., "InGaAs/InGaAsP MQW Electroabsorption Modulator Integrated with a DFB Laser Fabricated by Band-Gap Energy Control Selective Area MOCVD, 1993,"IEEE J Quantum Electronics, vol. 29, pp. 2088-2096.

Asano et al., "100-mW kink-Free Blue-Violet Laser Diodes with Low Aspect Ratio," 2003, IEEE Journal of Quantum Electronics, vol. 39, No. 1, pp. 135-140.

Asif Khan "Cleaved cavity optically pumped InGaN—GaN laser grown on spinel substrates," Appl. Phys. Lett. 69 (16), pp. 2418-2420 (Oct. 14, 1996).

Bernardini et al., "Spontaneous Polarization and Piezoelectric Constants of III-V Nitrides," 1997, Physical Review B, vol. 56, No. 16, pp. 10024-10027.

Caneau et al., "Studies on Selective OMVPE of (Ga,In)/(As,P),"1992, Journal of Crystal Growth, vol. 124, pp. 243-248.

(56) References Cited

OTHER PUBLICATIONS

Chen et al., "Growth and Optical Properties of Highly Uniform and Periodic InGaN Nanostructures," 2007, Advanced Materials, vol. 19, pp. 1707-1710.

D'Evelyn et al., "Bulk GaN Crystal Growth by the High-Pressure Ammonothermal Method," Journal of Crystal Growth, 2007, vol. 300, pp. 11-16.

Feezell et al.; "Short-Wave Diode Lasers: Nonpolar gallium nitride laser diodes are the next new blue"; Laser Focus World; Oct. 1, 2007; vol. 43, Issue 10 Retrieved from the Internet: <URL:http://www.laserfocusworld.com/content/lfw/en/articles/print/volume-43/issue-10/features/short-wave-diode-lasers-nonpolar-gallium-nitride-laser-dio-des-are-the-next-new-blue.html>.

Franssila, "Tools for CVD and Epitaxy", Introduction to Microfabrication, 2004, pp. 329-336.

Fujii et al., "Increase in the Extraction Efficiency of GaN-based Light-Emitting Diodes via Surface Roughening," 2004, Applied Physics Letters, vol. 84, No. 6, pp. 855-857.

Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.

Funato et al., "Monolithic Polychromatic Light-Emitting Diodes Based on InGaN Microfacet Quantum Wells toward Tailor-Made Solid-State Lighting," 2008, Applied Physics Express, vol. 1, pp. 011106-1-011106-3.

Founta et al., 'Anisotropic Morphology of Nonpolar a-Plane GaN Quantum Dots and Quantum Wells,' Journal of Applied Physics, vol. 102, vol. 7, 2007, pp. 074304-1-074304-6.

Gardner et al. "Blue-emitting InGaN-GaN double-heterostructure light-emitting diodes reaching maximum quantum efficiency above 200 A/cm2", Applied Physics Letters 91, 243506 (2007).

hap ://techon.nikkeibp. co jp/english/NEWS_EN/20080122/146009.

Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111.

Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kendall et al., "Energy Savings Potential of Solid State Lighting in General Lighting Applications," 2001, Report for the Department of Energy, pp. 1-35.

Kim et al, "Improved Electroluminescence on Nonpolar m-plane InGaN/GaN Qantum Well LEDs", 2007, Physica Status Solidi (RRL), vol. 1, No. 3, pp. 125-127.

Kuramoto et al., "Novel Ridge-Type InGaN Multiple-Quantum-Well Laser Diodes Fabricated by Selective Area Re-Growth on n-GaN Substrates," 2007, Journal of Japanese Applied Physics, vol. 40, pp. 925-927.

Lin et al. "Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).

Masui et al. "Electrical Characteristics of Nonpolar InGaN-Based Light-Emitting Diodes Evaluated at Low Temperature," Jpn. J. Appl. Phys. 46 pp. 7309-7310 (2007).

Michiue et al. "Recent development of nitride LEDs and LDs," Proceedings of SPIE, vol. 7216, 72161Z (2009).

Nakamura et al., "InGaN/Gan/AlGaN-based Laser Diodes with Modulation-doped Strained-layer Superlattices Grown on an Epitaxially Laterally Grown GaN Substrate", 1998, Applied Physics Letters, vol. 72, No. 12, pp. 211-213.

Nam et al., "Later Epitaxial Overgrowth of GaN films on SiO2 Areas via Metalorganic Vapor Phase Epitaxy," 1998, Journal of Electronic Materials, vol. 27, No. 4, pp. 233-237.

Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.

Okamoto et. al "Continuous-Wave Operation of m-Plane InGaN Multiple Quantum Well Laser Diodes" The Japan Society of I Applied Physics JJAP Express LEtter, vol. 46, No. 9, 2007 pp. L 187-L 189.

Okamoto et al. in "High-Efficiency Continuous-Wave Operation of Blue-Green Laser Diodes Based on Nonpolar m-Plane Gallium Nitride," The Japan Society of Applied Physics, Applied Physics Express 1 (Jun. 2008).

Park, "Crystal orientation effects on electronic properties of wurtzite InGaN/GaN quantum wells,",Journal of Applied Physics vol. 91, No. 12, pp. 9904-9908 (Jun. 2002).

Purvis, "Changing the Crystal Face of Gallium Nitride." The Advance Semiconductor Magazine, vol. 18, No. 8, Nov. 2005.

Romanov "Strain-induced polarization in wurtzite III-nitride semipolar layers," Journal of Applied Physics 100, pp. 023522-1 through 023522-10 (Jul. 25, 2006).

Sato et al., "High Power and High Efficiency Green Light Emitting Diode on free-Standing Semipolar (1122) Bulk GaN Substrate," 2007.Physica Status Solidi (RRL), vol. 1, pp. 162-164.

Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Schmidt et al., "Demonstration of Nonpolar m-plane InGaN/GaN Laser Diodes," 2007, Journal of Japanese Applied Physics, vol. 46, No. 9, pp. 190-191.

Schmidt et al., "High Power and High External Efficiency m-plane InGaN Light Emitting Diodes," 2007, Japanese Journal of Applied Physics, vol. 46, No. 7, pp. L126-L128.

Schoedl "Facet degradation of GaN heterostructure laser diodes," Journal of Applied Physics vol. 97, issue 12, pp. 123102-1 to 123102-8 (2005).

Shchekin et al., "High Performance Thin-film Flip-Chip InGaN-GaN Light-emitting Diodes," 2006, Applied Physics Letters, vol. 89, pp. 071109-071109-3.

Shen et al. "Auger recombination in InGaN measured by photoluminescence," Applied Physics Letters, 91, 141101 (2007).

Sizov et al., "500-nm Optical Gain Anisotropy of Semipolar (1122) InGaN Quantum Wells," 2009, Applied Physics Express, vol. 2, pp. 071001-1-071001-3.

Tomiya et. al. Dislocation related issues in the degradation of GaN-based laser diodes, IEEE Journal of Selected Topics in Quantum Electronics vol. 10, No. 6 (2004).

Tyagi et al., "High Brightness Violet InGaN/GaN Light Emitting Diodes on Semipolar (1011) Bulk GaN Substrates," 2007, Japanese Journal of Applied Physics, vol. 46, No. 7, pp. L129-L131.

Tyagi et al., 'Semipolar (1011) InGaN/GaN Laser Diodes on Bulk GaN Substrates,' Japanese Journal of Applied Physics, vol. 46, No. 19, 2007, pp. L444-L445.

Uchida et al.,"Recent Progress in High-Power Blue-violet Lasers," 2003, IEEE Journal of Selected Topics in Quantum Electronics, vol. 9, No. 5, pp. 1252-1259.

Waltereit et al., "Nitride Semiconductors Free of Electrostatic Fields for Efficient White Light-emitting Diodes," 2000, Nature: International Weekly Journal of Science, vol. 406, pp. 865-868.

Wierer et al., "High-power AlGaInN Flip-chip Light-emitting Diodes," 2001, Applied Physics Letters, vol. 78, No. 22, pp. 3379-3381.

Yamaguchi, A. Atsushi, "Anisotropic Optical Matrix Elements in Strained GaN-quantum Wells with Various Substrate Orientations," 2008, Physica Status Solidi (PSS), vol. 5, No. 6, pp. 2329-2332.

Yoshizumi et al. "Continuous-Wave operation of 520 nm Green InGaN-Based Laser Diodes on Semi-Polar {20-21} GaN Substrates," Applied Physics Express 2 (2009).

Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), paper JTuA92.

Zhong et al., "Demonstration of High Power Blue-Green Light Emitting Diode on Semipolar (1122) Bulk GaN Substrate," 2007, Electron Letter, vol. 43, No. 15, pp. 825-826.

(56) References Cited

OTHER PUBLICATIONS

Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.
International Search Report of PCT Application No. PCT/US2009/047107, dated Sep. 29, 2009, 4 pages.
International Search Report of PCT Application No. PCT/US2009/046786, dated May 13, 2010, 2 pages.
International Search Report of PCT Application No. PCT/US2009/52611, dated Sep. 29, 2009, 3 pages.
International Search Report & Written Opinion ofPCT Application No. PCT/US2010/030939, dated Jun. 16, 2010, 9 pages.
International Search Report & Written Opinion of PCT Application No. PCT/US2010/049172, dated Nov. 17, 2010, 7 pages.
International Search Report of PCT Application No. PCT/US2011/037792, dated Sep. 8, 2011, 2 pages.
International Search Report & Written Opinion of PCT Application No. PCT/US2011/060030, dated Mar. 21, 2012, 11 pages.
Non-Final Office Action of Nov. 21, 2011 for U.S. Appl. No. 12/759,273, 10 pages.
Final Office Action of Jun. 26, 2012 for U.S. Appl. No. 12/759,273, 12 pages.
Non-Final Office Action of Nov. 20, 2013 for U.S. Appl. No. 13/549,335, 12 pages.
Notice of Allowance of Mar. 20, 2014 for U.S. Appl. No. 13/549,335, 19 pages.
Non-Final Office Action of Apr. 3, 2014 for U.S. Appl. No. 12/759,273, 30 pages.
Non-Final Office Action of Jun. 19, 2014 for U.S. Appl. No. 14/134,244, 21 pages.
Final Office Action of Oct. 24, 2014 for U.S. Appl. No. 12/759,273, 16 pages.

\* cited by examiner

OPTICAL DEVICE STRUCTURE USING GAN SUBSTRATES AND GROWTH STRUCTURES FOR LASER APPLICATIONS

CROSS-REFERENCE TO RELATED APPLICATIONS

This application is a division of U.S. application Ser. No. 13/549,335 filed on Jul. 13, 2012, which is a continuation-in-part of U.S. application Ser. No. 12/884,993 filed on Sep. 17, 2010, which claims priority from U.S. Provisional Application No. 61/249,568 filed on Oct. 7, 2009 and from U.S. Provisional Application No. 61/243,502 filed on Sep. 17, 2009; and U.S. application Ser. No. 13/549,335 is a continuation-in-part of U.S. application Ser. No. 12/778,718 filed on May 12, 2010, which claims priority from U.S. Provisional Application No. 61/177,317 filed on May 12, 2009; and U.S. application Ser. No. 13/549,335 is a continuation-in-part of U.S. application Ser. No. 12/762,269 filed on Apr. 16, 2010, which claims priority from U.S. Provisional Application No. 61/243,502 filed on Sep. 17, 2009, from U.S. Provisional Application No. 61/177,218 filed on May 11, 2009, from U.S. Provisional Application No. 61/170,550 filed on Apr. 17, 2009, and from U.S. Provisional Application No. 61/170,553 filed on Apr. 17, 2009; and U.S. application Ser. No. 13/549,335 is a continuation-in-part of U.S. application Ser. No. 12/762,271 filed on Apr. 16, 2010, which claims priority from U.S. Provisional Application No. 61/243,502 filed on Sep. 17, 2009, from U.S. Provisional Application No. 61/177,227 filed on May 11, 2009, from U.S. Provisional Application No. 61/170,550 filed on Apr. 17, 2009, and from U.S. Provisional Application No. 61/170,553 filed on Apr. 17, 2009; and U.S. application Ser. No. 13/549,335 is a continuation-in-part of U.S. application Ser. No. 12/759,273 filed on Apr. 13, 2010, which claims priority from U.S. Provisional Application No. 61/243,502 filed on Sep. 17, 2009, and from U.S. Provisional Application No. 61/168,926 filed on Apr. 13, 2009; each of which is commonly-assigned and each of which are hereby incorporated by reference in its entirety.

BACKGROUND OF THE INVENTION

This invention is directed to optical devices and related methods. More particularly, the invention provides a method of manufacture and a device for emitting electromagnetic radiation using semipolar or non-polar gallium containing substrates such as GaN, MN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices.

In the late 1800's, Thomas Edison invented the light bulb. The conventional light bulb, commonly called the "Edison bulb," has been used for over one hundred years for a variety of applications including lighting and displays. The conventional light bulb uses a tungsten filament enclosed in a glass bulb sealed in a base, which is screwed into a socket. The socket is coupled to an AC or DC power source. The conventional light bulb can be found commonly in houses, buildings, and outdoor lightings, and other areas requiring light or displays.

Unfortunately, drawbacks exist with the conventional Edison light bulb. First, the conventional light bulb dissipates much thermal energy. More than 90% of the energy used for the conventional light bulb dissipates as thermal energy. Second, reliability is less than desired—the conventional light bulb routinely fails due to thermal expansion and contraction of the filament element. In addition, conventional light bulbs emit light over a broad spectrum, much of which does not result in illumination at wavelengths of spectral sensitivity to the human eye. Finally, conventional light bulbs emit light in all directions. They therefore are not ideal for applications requiring strong directionality or focus, such as projection displays, optical data storage, or specialized directed lighting.

In 1960, the laser was first demonstrated by Theodore H. Maiman at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas Argon ion laser. The Ar-ion laser utilized a noble gas as the active medium and produced laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was less than 0.1%. The size, weight, and cost of the laser was undesirable as well.

As laser technology evolved, more efficient lamp pumped solid state laser designs were developed for the red and infrared wavelengths, but these technologies remained a challenge for blue and green lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG). These had wall plug efficiency of ~1%, and were more efficient than Ar-ion gas lasers, but were still too inefficient, large, expensive, and fragile for broad deployment outside of specialty scientific and medical applications. Additionally, the gain crystal used in the solid state lasers typically had energy storage properties which made the lasers difficult to modulate at high speeds, limiting broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5-10%. This sparked further commercialization into specialty industrial, medical, and scientific applications. The change to diode pumping, however, increased the system cost and required precise temperature controls, leaving the laser with substantial size and power consumption. The result did not address the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are intended to provide improved efficiency, cost and size compared to DPSS-SHG lasers, but the specialty diodes and crystals required make this challenging today. Additionally, while the diode-SHG lasers have the benefit of being directly modulated, they suffer from sensitivity to temperature which limits their application. Further, the spectral linewidth of SHG-based lasers is typically very narrow at about 0.1 nm, which can lead to a severe image distortion called speckle in display applications.

BRIEF SUMMARY OF THE INVENTION

This invention provides a manufacturing method and a device for emitting electromagnetic radiation using semipolar or non-polar gallium containing substrates such as GaN, MN, InN, InGaN, AlGaN, and AlInGaN, and others. Merely by way of example the invention can be applied to the non-polar m-plane or to the semipolar (11-22), (30-31), (30-3-1), (20-21), (20-2-1), (30-32), or (30-3-2), or offcuts thereof. Merely by way of example, the invention can be applied to optical devices, lasers, light emitting diodes, solar cells, photoelectrochemical water splitting and hydrogen generation, photodetectors, integrated circuits, and transistors, among other devices. Laser diodes according to this invention can offer improved efficiency, cost, temperature sensitivity, and ruggedness over lasers based on SHG technology. Moreover, laser diodes according to this invention can provide an output with a spectral linewidth of 0.5 to 2 nm, which is advantageous in display applications where speckle must be considered.

This invention provides an optical device, which includes a gallium nitride substrate having a semipolar or nonpolar crystalline surface region. The device also has an n-type cladding layer overlying the substrate surface. In a preferred embodiment, the n-type GaN cladding layer has a thickness from 100 nm to 5000 nm with a silicon doping level of 1E17 to 5E18 cm-3. The device has an n-side SCH layer overlying the n-type cladding layer. Preferably, the n-side SCH layer is comprised of InGaN with molar fraction of indium of between 1% and 7% and has a thickness from 40 to 150 nm. The optical device also has a multiple quantum well active region overlying the n-side SCH layer. Preferably, the multiple quantum well active region is comprised of two to five 2.5-4.5 nm InGaN quantum wells separated by 3.7-5.5 nm or 7.5 to 20 nm gallium and nitrogen containing barriers such as GaN. Preferably the optical device has a p-side guide layer overlying the multiple quantum well active region. In a preferred embodiment, the p-side guide layer comprises GaN or InGaN and has a thickness from 20 nm to 100 nm. The optical device has an electron blocking layer overlying the p-side guide layer. Preferably, the electron blocking layer comprises a magnesium doped AlGaN layer with molar fraction of aluminum of between 6% and 22% at a thickness from 10 nm to 25 nm. Preferably the optical device also has a p-type cladding layer overlying the electronic blocking layer. The p-type cladding layer has a thickness from 300 nm to 1000 nm with a magnesium doping level of 2E17 cm-3 to 1E19 cm-3 according to one or more embodiments. The device also has a p++-gallium and nitrogen contact layer overlying the p-type cladding layer. The P++-gallium and nitrogen containing layer typically has a thickness from 10 nm to 120 nm with a Mg doping level of 1E19 cm-3 to 1E21 cm-3.

The present invention enables a cost-effective optical device for laser applications. In a specific embodiment, the optical device can be manufactured in a relatively simple and cost effective manner. Depending upon the embodiment, the present apparatus and method can be manufactured using conventional materials and/or methods. The laser device uses a semipolar or non-polar gallium nitride material capable of providing green laser light. In some embodiments, the laser is capable of emitting long wavelengths, for example, those ranging from about 470 nm to greater than about 535 nm, as well as others. A further understanding of the nature and advantages of the present invention may be appreciated by reference to the following portions of the specification and the accompanying drawings.

DETAILED DESCRIPTION OF THE INVENTION

According to the present invention, techniques related generally to optical devices are provided. More particularly, the present invention provides a method and device for emitting electromagnetic radiation using semipolar or non-polar gallium containing substrates such as GaN, MN, InN, InGaN, AlGaN, and AlInGaN, and others. Merely by way of example the invention can be applied to the non-polar m-plane or to the semipolar (11-22), (30-31), (30-3-1), (20-21), (20-2-1), (30-32), or (30-3-2), or offcuts thereof. Merely by way of example, the invention can be applied to optical devices, lasers, light emitting diodes, solar cells, photoelectrochemical water splitting and hydrogen generation, photodetectors, integrated circuits, and transistors, among other devices. In a specific embodiment, the present laser device can be employed in either a semipolar or non-polar gallium containing substrate, as described below. Laser diodes according to this invention can offer improved efficiency, cost, temperature sensitivity, and ruggedness over lasers based on SHG technology. Moreover, laser diodes according to this invention can provide an output with a spectral linewidth of 0.5 to 2 nm, which is advantageous in display applications where speckle must be considered.

Figure 1A:
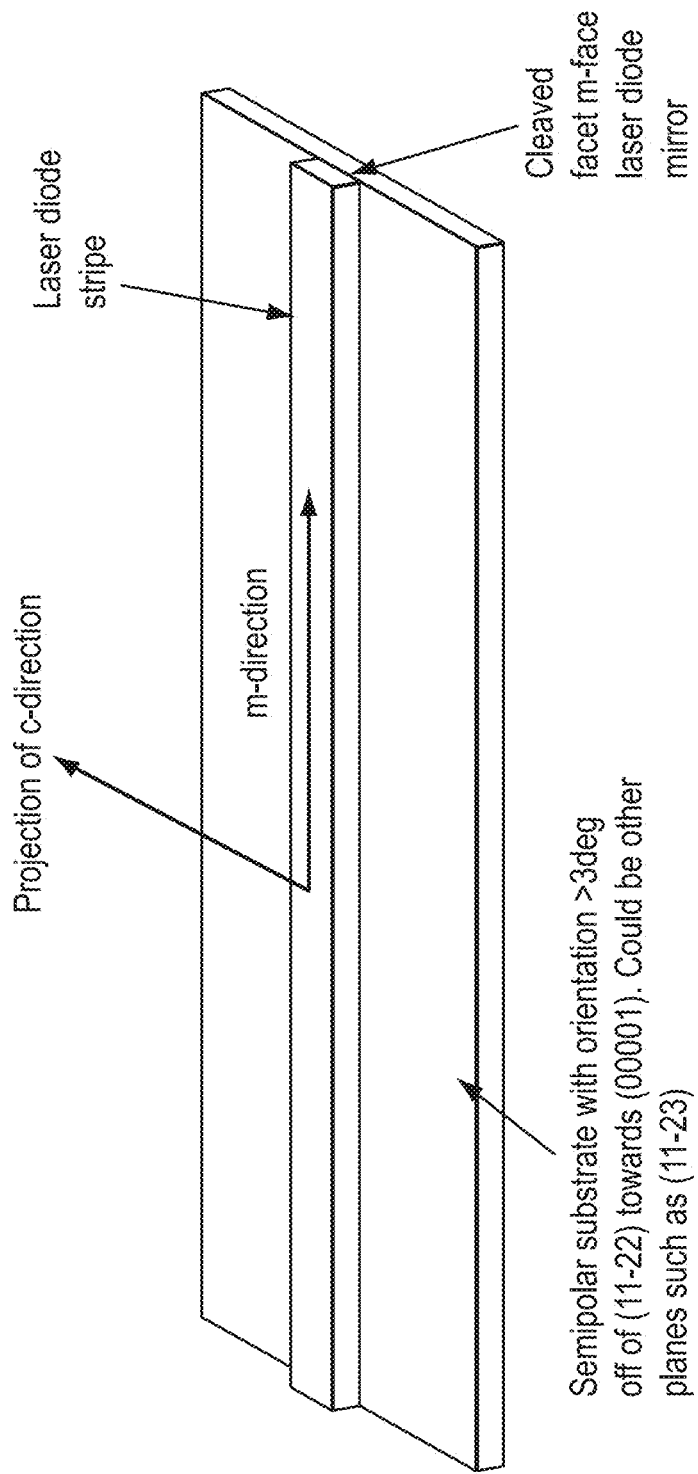
FIG. 1A is a simplified perspective view of a laser device fabricated on a semipolar substrate according to an embodiment of the present invention.

FIG. 1A is a simplified perspective view of a laser device 100 fabricated on a semipolar substrate according to an embodiment of the present invention. This diagram is merely an example, which should not unduly limit the scope of the claims herein. One of ordinary skill in the art would recognize other variations, modifications, and alternatives. As shown, the optical device includes a gallium nitride substrate member 101 having a semipolar or non-polar crystalline surface region. In a specific embodiment, the gallium nitride substrate member is a bulk GaN substrate characterized by having a semipolar or non-polar crystalline surface region, but can be others. In a specific embodiment, the bulk nitride GaN substrate comprises nitrogen and has a surface dislocation density below $10^7$ cm$^{-2}$ or $10^5$ cm$^{-2}$. The nitride crystal or wafer may comprise $Al_xIn_yGa_{1-x-y}N$, where $0 \le x, y, x+y \le 1$. In one specific embodiment, the nitride crystal comprises GaN. In one or more embodiments, the GaN substrate has threading dislocations, at a concentration between about $10^5$ cm$^{-2}$ and about $10^8$ cm$^{-2}$, in a direction that is substantially orthogonal or oblique with respect to the surface. As a consequence of the orthogonal or oblique orientation of the dislocations, the surface dislocation density is below about $10^7$ cm$^{-2}$ or below about $10^5$ cm$^{-2}$. In a specific embodiment, the device can be fabricated on a slightly off-cut semipolar substrate as described in U.S. application Ser. No. 12/749,466, which claims priority to U.S. Provisional No. 61/164,409 filed on Mar. 28, 2009, commonly assigned, and hereby incorporated by reference herein.

In a specific embodiment on semipolar GaN, the device has a laser stripe region formed overlying a portion of the semi polar crystalline orientation surface region. In a specific semipolar GaN embodiment, the laser stripe region is characterized by a cavity orientation is substantially parallel to the m-direction. In a specific embodiment, the laser strip region has a first end 107 and a second end 109.

Figure 1B:
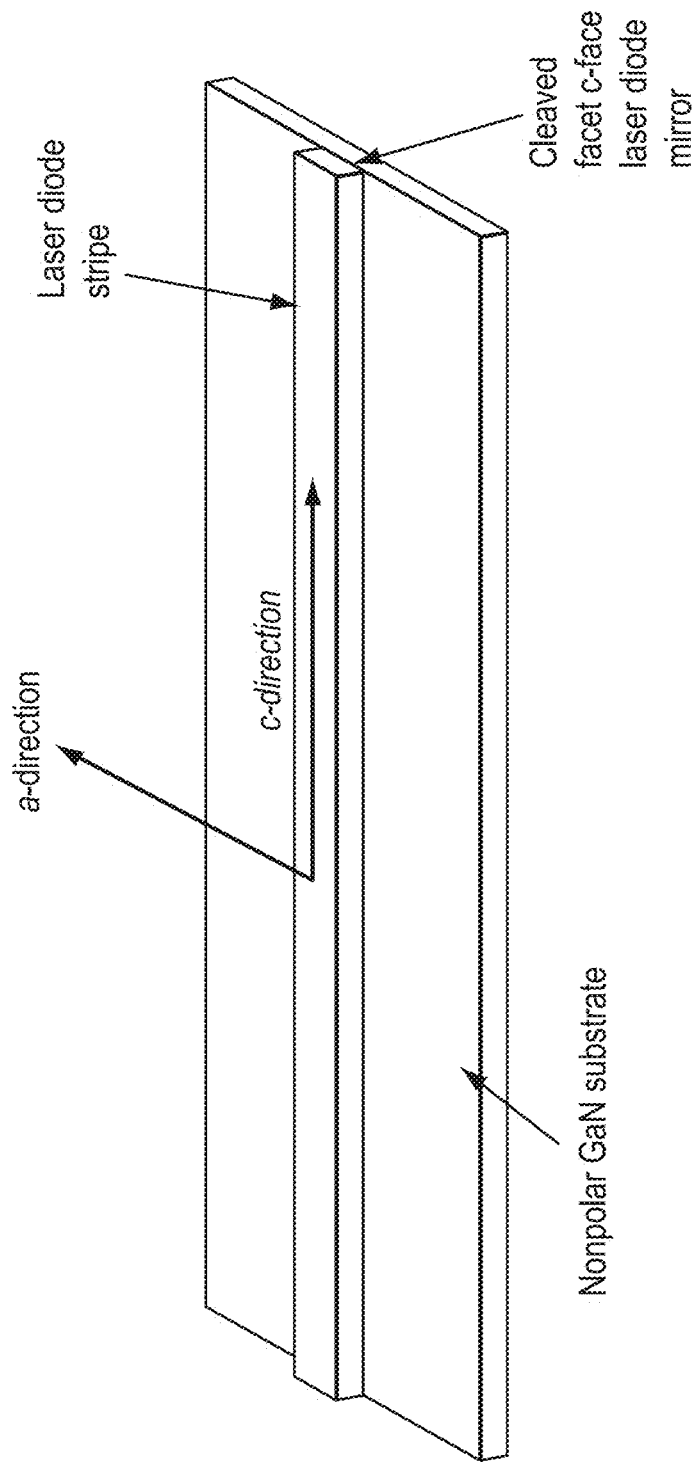
FIG. 1B is a simplified perspective view of a laser device fabricated on a non-polar substrate according to an embodiment of the present invention.

In a specific embodiment on nonpolar GaN, the device has a laser stripe region formed overlying a portion of the semi or non-polar crystalline orientation surface region, as illustrated by FIG. 1B. The laser stripe region is characterized by a cavity orientation which is substantially parallel to the c-direction. The laser strip region has a first end and a second end. Typically, the non-polar crystalline orientation is configured on an m-plane, which leads to polarization ratios parallel to the a-direction. In some embodiments, the m-plane is the (10-10) family. Of course, the cavity orientation can also be substantially parallel to the a-direction as well. In the specific nonpolar GaN embodiment having the cavity orientation substantially parallel to the c-direction is further described in "Laser Device and Method Using Slightly Miscut Non-Polar GaN Substrates," in the names of Raring, James W. and Pfister, Nick listed as U.S. application Ser. No. 12/759,273, which claims priority to U.S. Provisional Ser. No. 61/168,926 filed on Apr. 13, 2009, commonly assigned, and hereby incorporated by reference for all purposes.

In a preferred semipolar embodiment, the device has a first cleaved semipolar facet provided on the first end of the laser stripe region and a second cleaved semipolar facet provided on the second end of the laser stripe region. The first cleaved semipolar facet is substantially parallel with the second cleaved semipolar facet. In a specific embodiment, the semipolar substrate is configured on a (30-31), (30-3-1), (20-21), (20-2-1), (30-32), (30-3-2) or offcut. The laser waveguide cavity is aligned in the projection of the c-direction. Mirror surfaces are formed on each of the cleaved surfaces. The first cleaved semipolar facet comprises a first mirror surface, typically provided by a scribing and breaking process. The scribing process can use any suitable technique, such as a diamond scribe or laser scribe or combinations. In a specific embodiment, the first mirror surface comprises a reflective coating. The reflective coating is selected from silicon dioxide, hafnia, and titania, tantalum pentoxide, zirconia, aluminum oxide, including combinations, and the like. Depending upon the embodiment, the first mirror surface can be provided by an anti-reflective coating. Of course, there can be other variations, modifications, and alternatives.

Also in a preferred semipolar embodiment, the second cleaved semipolar facet comprises a second mirror surface. The second mirror surface can be provided by a scribing and breaking process. Preferably, the scribing is performed by diamond or laser scribing. In a specific embodiment, the second mirror surface comprises a reflective coating, such as silicon dioxide, hafnia, and titania, tantalum pentoxide, zirconia, aluminum oxide, combinations, and the like. In a specific embodiment, the second mirror surface comprises an anti-reflective coating. Of course, there can be other variations, modifications, and alternatives.

In an alternative preferred semipolar embodiment, the device has a first cleaved m-face facet provided on the first end of the laser stripe region and a second cleaved m-face facet provided on the second end of the laser stripe region. The first cleaved m-facet is substantially parallel with the second cleaved m-facet. In a specific embodiment, the semipolar substrate is configured on (11-22) series of planes, enabling the formation of m-facets for laser cavities oriented in the m-direction. Mirror surfaces are formed on each of the cleaved surfaces. The first cleaved m-facet comprises a first mirror surface, typically provided by a scribing and breaking process. The scribing process can use any suitable technique, such as a diamond scribe or laser scribe or combinations. In a specific embodiment, the first mirror surface comprises a reflective coating. The reflective coating is selected from silicon dioxide, hafnia, and titania, tantalum pentoxide, zirconia, aluminum oxide, including combinations, and the like. Depending upon the embodiment, the first mirror surface can be provided by an anti-reflective coating. Of course, there can be other variations, modifications, and alternatives.

In a preferred nonpolar embodiment, the device has a first cleaved c-face facet provided on the first end of the laser stripe region and a second cleaved c-face facet provided on the second end of the laser stripe region. In one or more embodiments, the first cleaved c-facet is substantially parallel with the second cleaved c-facet. In a specific embodiment, the nonpolar substrate is configured on (10-10) series of planes, which enables the formation of c-facets for laser cavities oriented in the c-direction. Mirror surfaces are formed on each of the cleaved surfaces. The first cleaved c-facet comprises a first mirror surface. In a preferred embodiment, the first mirror surface is provided by a scribing and breaking process. The scribing process can use any suitable techniques, such as a diamond scribe or laser scribe or combinations. In a specific embodiment, the first mirror surface comprises a reflective coating. The reflective coating is selected from silicon dioxide, hafnia, and titania, tantalum pentoxide, zirconia, aluminum oxide including combinations, and the like. Depending upon the embodiment, the first mirror surface can also comprise an anti-reflective coating. Of course, there can be other variations, modifications, and alternatives.

Also in a preferred nonpolar embodiment, the second cleaved c-facet comprises a second mirror surface. The second mirror surface can be provided by a scribing and breaking process, for example, diamond or laser scribing or the like. In a specific embodiment, the second mirror surface comprises a reflective coating, such as silicon dioxide, hafnia, and titania, tantalum pentoxide, zirconia, aluminum oxide, combinations, and the like. In a specific embodiment, the second mirror surface comprises an anti-reflective coating. Of course, there can be other variations, modifications, and alternatives.

In a specific embodiment, the laser stripe has a length and width. The length ranges from about 250 microns to about 3000 microns. The strip also has a width ranging from about 0.5 microns to about 50 microns, but can be other dimensions.

In a specific embodiment, the width is substantially constant in dimension, although there may be slight variations. The width and length are often formed using a masking and etching process, such as commonly used in the art.

In a specific semipolar embodiment, the device is also characterized by a spontaneously emitted light that is polarized in substantially parallel to the projection of the c-direction. That is, the device performs as a laser or the like. In a preferred embodiment, the spontaneously emitted light is characterized by a polarization ratio of greater than about 0.2 and less than about 1 parallel to the projection of the c-direction. In a preferred embodiment, the spontaneously emitted light is characterized by a wavelength ranging from about 500 to about 580 nanometers to yield a green laser. The spontaneously emitted light is highly polarized and is characterized by a polarization ratio parallel to the projection of the c-direction of greater than 0.4. Of course, there can be other variations, modifications, and alternatives.

In a specific nonpolar embodiment, the device is also characterized by a spontaneously emitted light that is polarized parallel to the a-direction. That is, the device performs as a laser or the like. In a preferred embodiment, the spontaneously emitted light is characterized by a polarization ratio of greater than about 0.1 and less than about 1 parallel to the projection of the c-direction. In a preferred embodiment, the spontaneously emitted light characterized by a wavelength ranging from about 475 to about 540 nanometers to yield a blue-green or green laser and others and the spontaneously emitted light is highly polarized and is characterized by a polarization ratio parallel to the a-direction of greater than 0.5. Of course, there can be other variations, modifications, and alternatives.

Figure 2:
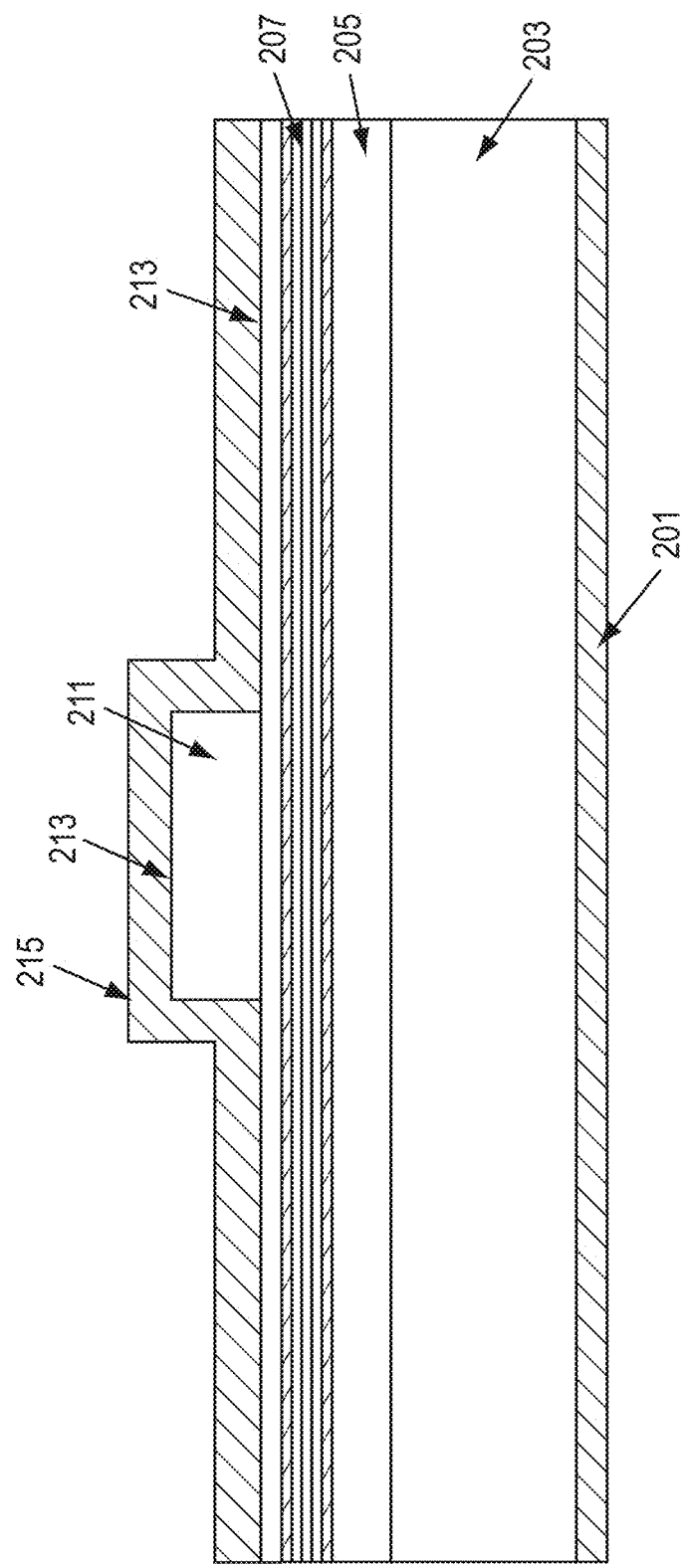
FIG. 2 is a detailed cross-sectional view of a laser device fabricated on a non-polar substrate according to an embodiment of the present invention.

FIG. 2 is a detailed cross-sectional view of a laser device 200 fabricated on a non-polar substrate according to one embodiment of the present invention. As shown, the laser device includes gallium nitride substrate 203, which has an underlying n-type metal back contact region 201. The metal back contact region preferably is made of a suitable material such as those noted below.

In a specific embodiment, the device also has an overlying n-type gallium nitride layer 205, an active region 207, and an overlying p-type gallium nitride layer structured as a laser stripe region 209. In a specific embodiment, each of these regions is formed using an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

In a specific embodiment, an n-type $Al_uIn_vGa_{1-u-v}N$ layer, where $0 \leq u$, v, $u+v \leq 1$, is deposited on the substrate. In a specific embodiment, the carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE).

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 800 and about 1100 degrees Celsius in the presence of a nitrogen-containing gas. In one specific embodiment, the susceptor is heated to approximately 1000 degrees Celsius under flowing ammonia. A flow of a gallium-containing metalorganic precursor, such as tri- methylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm, is initiated.

In a specific embodiment, the laser stripe region is made of the p-type gallium nitride layer 209. In a specific embodiment, the laser stripe is provided by an etching process selected from dry etching or wet etching. In a preferred embodiment, the etching process is dry, but other processes can be used. As an example, the dry etching process is an inductively coupled process using chlorine bearing species or a reactive ion etching process using similar chemistries. The chlorine bearing species are commonly derived from chlorine gas or the like. The device also has an overlying dielectric region, which exposes 213 contact region. In a specific embodiment, the dielectric region is an oxide such as silicon dioxide or silicon nitride. The contact region is coupled to an overlying metal layer 215. The overlying metal layer is a multilayered structure containing gold and nickel (Ni/Au), gold and palladium (Pd/Au), gold and platinum (Pt/Au), but can be others.

In a specific embodiment, the laser device has active region 207. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 1-10 quantum wells. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where $0 \leq w$, x, y, z, w+x, y+z $\leq 1$, where w<u, y and/or x>v, z so that the bandgap of the well layer(s) is less than that of the barrier layer(s) and the n-type layer. The well layers and barrier layers may each have a thickness between about 1 nm and about 40 nm. In another embodiment, the active layer comprises a double heterostructure, with an InGaN or $Al_wIn_xGa_{1-w-x}N$ layer about 10 nm to 100 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped (or unintentionally doped) or may be doped n-type or p-type.

In a specific embodiment, the active region can also include an electron blocking region, and a separate confinement heterostructure. In some embodiments, an electron blocking layer is preferably deposited. The electron-blocking layer may comprise $Al_sIn_tGa_{1-s-t}N$, where $0 \leq s$, t, s+t $\leq 1$, with a higher bandgap than the active layer, and may be doped p-type. In one specific embodiment, the electron blocking layer comprises AlGaN. In another embodiment, the electron blocking layer comprises an AlGaN/GaN super-lattice structure, comprising alternating layers of AlGaN and GaN, each with a thickness between about 0.2 nm and about 5 nm.

As noted, the p-type gallium nitride structure, which can be a p-type doped $Al_qIn_rGa_{1-q-r}N$, where $0 \leq q$, r, q+r $\leq 1$, layer is deposited above the active layer. The p-type layer may be doped with Mg, to a level between about $10^{16}$ cm$^{-3}$ and $10^{22}$ cm$^{-3}$, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by a dry etching process, but wet etching may also be used. The device also has an overlying dielectric region, which exposes contact region 213. In a specific embodiment, the dielectric region is an oxide such as silicon dioxide.

In a specific embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device. Of course, there can be other variations, modifications, and alternatives. Further details of the cleaved facets appear below.

Figure 3:
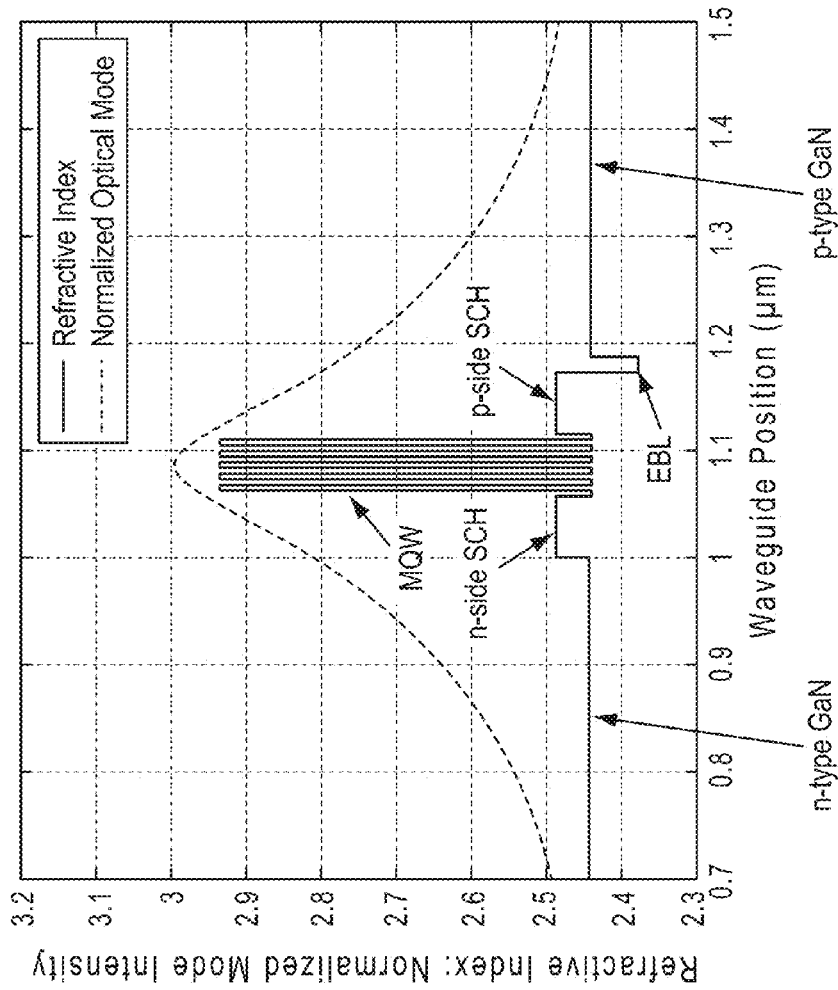
FIG. 3 is a simplified diagram illustrating an epitaxial laser structure according to a preferred embodiment of the present invention.

FIG. 3 is a simplified diagram illustrating a laser structure according to a preferred embodiment of the present invention. This diagram is merely an example, which should not unduly limit the scope of the claims herein. One of ordinary skill in the art would recognize other variations, modifications, and alternatives. In a specific embodiment, the device includes a starting material such as a bulk nonpolar or semipolar GaN substrate, but can be others. In a specific embodiment, the device is configured to achieve emission wavelength ranges of 390 nm to 420 nm, 420 nm to 440 nm, 440 nm to 470 nm, 470 nm to 490 nm, 490 nm to 510 nm, 510 nm to 530 nm, and 530 nm to 550 nm, but can be others.

In a preferred embodiment, the growth structure is configured using between 2 and 4 or 5 and 7 quantum wells positioned between n-type and p-type gallium and nitrogen containing cladding layers such as GaN, AlGaN, or InAlGaN. In a specific embodiment, the n-type cladding layer ranges in thickness from 500 nm to 5000 nm and has an n-type dopant such as Si with a doping level of between $1E18$ $cm^{-3}$ and $3E18$ $cm^{-3}$. In a specific embodiment, the p-type cladding layer ranges in thickness from 300 nm to 1000 nm and has a p-type dopant such as Mg with a doping level of between $1E17$ $cm^{-3}$ and $5E19$ $cm^{-3}$. In a specific embodiment, the Mg doping level is graded such that the concentration would be lower in the region closer to the quantum wells.

In a specific preferred embodiment, the quantum wells have a thickness of between 2.0 nm and 4.0 nm or 4.0 nm and 7.0 nm, but can be others. In a specific embodiment, the quantum wells would be separated by barrier layers with thicknesses between 4 nm and 8 nm or 8 nm and 18 nm. The quantum wells and the barriers together comprise a multiple quantum well (MQW) region.

In a preferred embodiment, the device has barrier layers formed from GaN or InGaN. In a specific embodiment using InGaN, the indium contents range from 1% to 5% (molar percent).

An InGaN separate confinement heterostructure layer (SCH) could be positioned between the n-type cladding and the MQW region according to one or more embodiments. Typically, such separate confinement layer is commonly called the n-side SCH. The n-side SCH layer ranges in thickness from 10 nm to 50 nm or 50 nm to 150 nm and ranges in indium composition from 1% to 8% (mole percent), but can be others. In a specific embodiment, the n-side SCH layer may or may not be doped with an n-type dopant such as Si.

In yet another preferred embodiment, an InGaN separate confinement heterostructure layer (SCH) is positioned between the p-type cladding layer and the MQW region, which is called the p-side SCH. In a specific embodiment, the p-side SCH layer ranges in thickness from 10 nm to 50 nm or 50 nm to 100 nm and ranges in indium composition from 1% to 7% (mole percent), but can be others. The p-side SCH layer may or may not be doped with a p-type dopant such as Mg. In another embodiment, the structure would contain both an n-side SCH and a p-side SCH.

In a specific preferred embodiment, an AlGaN electron blocking layer, with an aluminum content of between 6% and 22% (mole percent), is positioned between the MQW and the p-type cladding layer either within the p-side SCH or between the p-side SCH and the p-type cladding. The AlGaN electron blocking layer ranges in thickness from 10 nm to 30 nm and is doped with a p-type dopant such as Mg from 1E18 cm-3 and 1E20 cm-3 according to a specific embodiment.

Preferably, a p-contact layer positioned on top of and is formed overlying the p-type cladding layer. The p-contact layer would be comprised of a gallium and nitrogen containing layer such as GaN doped with a p-dopant such as Mg at a level ranging from $1E19$ $cm^{-3}$ to $1E22$ $cm^{-3}$.

Several more detailed embodiments, not intended to limit the scope of the claims, are described below.

Figure 4:
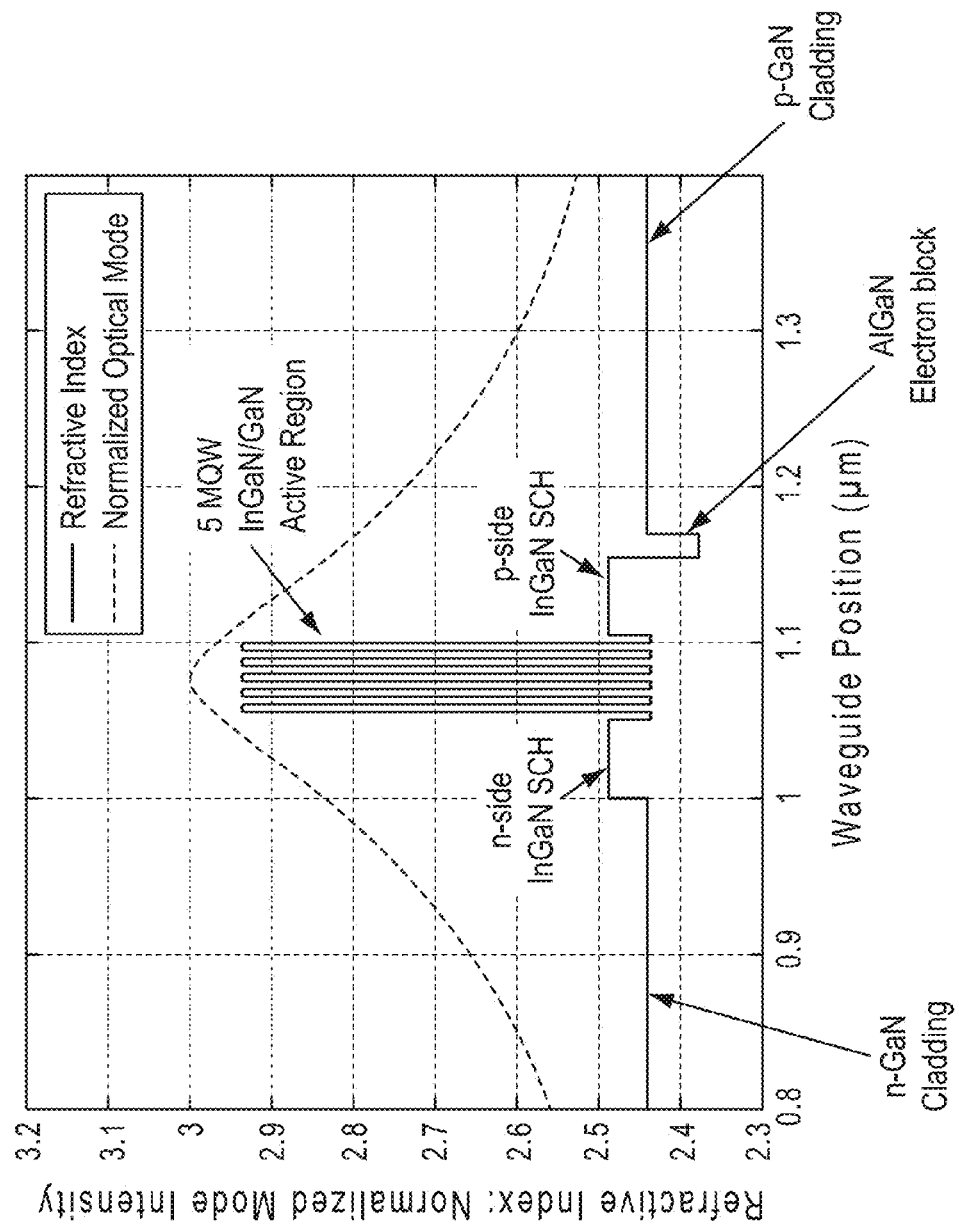
FIGS. 4 through 6 are simplified diagrams illustrating a laser device for a laser device according to a first embodiment of the present invention.
Figure 5:
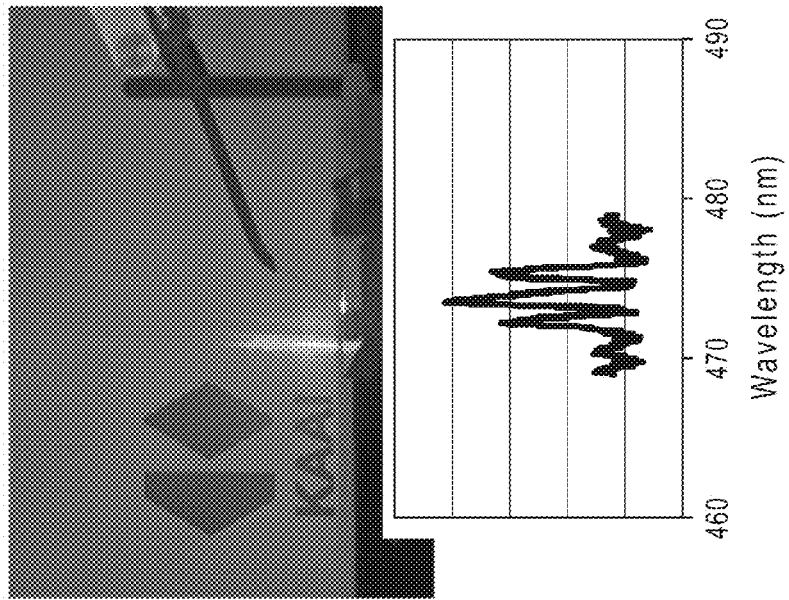
Figure 6:
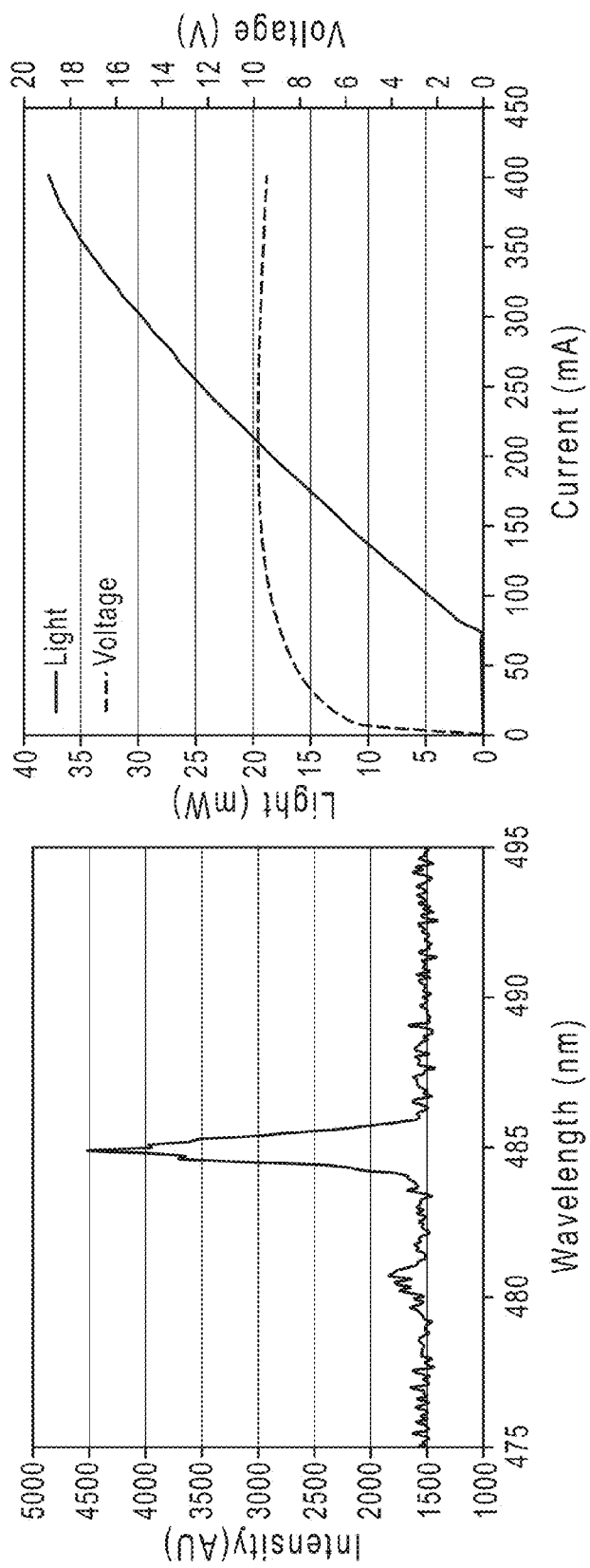
Figure 7:
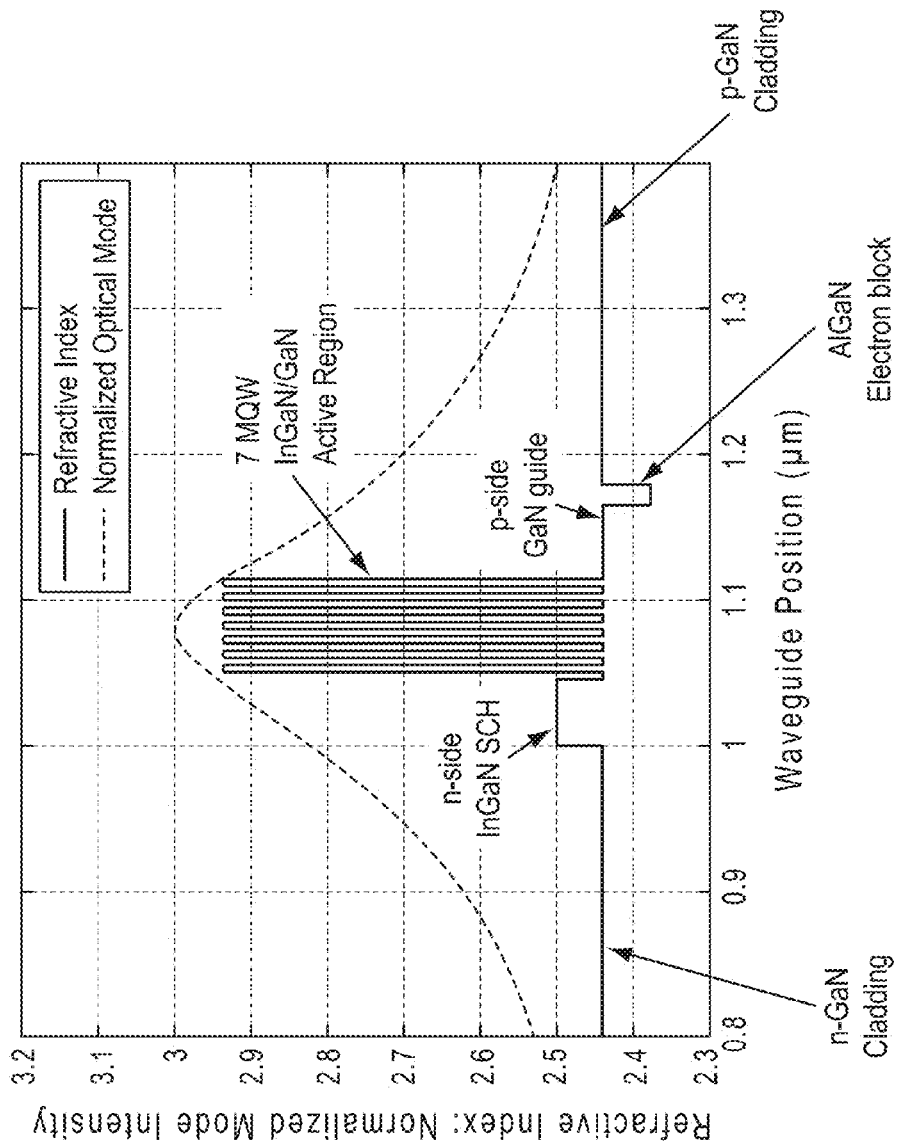
FIGS. 7 through 8 are simplified diagrams illustrating a laser device for a laser device according to a second embodiment of the present invention.

In a specific embodiment, the present invention provides a laser device capable of emitting 474 nm and also 485 nm, or 470 nm to 490 nm, or 510 nm to 535 nm wavelength light. The device is provided with one or more of the following elements, as also referenced in FIGS. 4 through 6:

an n-type cladding layer with a thickness from 1000 nm to 5000 nm with Si doping level of $1E17$ $cm^{-3}$ to $3E18$ $cm^{-3}$;

an n-side SCH layer comprised of InGaN with molar fraction of indium of between 1.5% and 6% and thickness from 35 to 125 nm;

a multiple quantum well active region layers comprised of three to five 2.5-5.0 nm InGaN quantum wells separated by six 4.5-5.5 nm GaN barriers;

a p-side SCH layer comprised of InGaN with molar fraction of indium of between 1.5% and 5% and thickness from 15 nm to 85 nm;

an electron blocking layer comprised of AlGaN with molar fraction of aluminum of between 6% and 22% and thickness from 10 nm to 15 nm and doped with Mg;

a p-type cladding layer with a thickness from 300 nm to 1000 nm with Mg doping level of $5E17$ $cm^{-3}$ to $1E19$ $cm^{-3}$; and a p++-GaN contact layer with a thickness from 20 nm to 55 nm with Mg doping level of $1E20$ $cm^{-3}$ to $1E21$ $cm^{-3}$.

In a specific embodiment, the above laser device is fabricated on a nonpolar oriented surface region. Preferably, the 474 nm configured laser device uses a nonpolar (10-10) substrate with a miscut or off cut of −0.3 to 0.3 degrees towards (0001) and −0.3 to 0.3 degrees towards (11-20). In a specific embodiment, the n-GaN/p-GaN is grown using an $N_2$ subflow and $N_2$ carrier gas.

Figure 8:
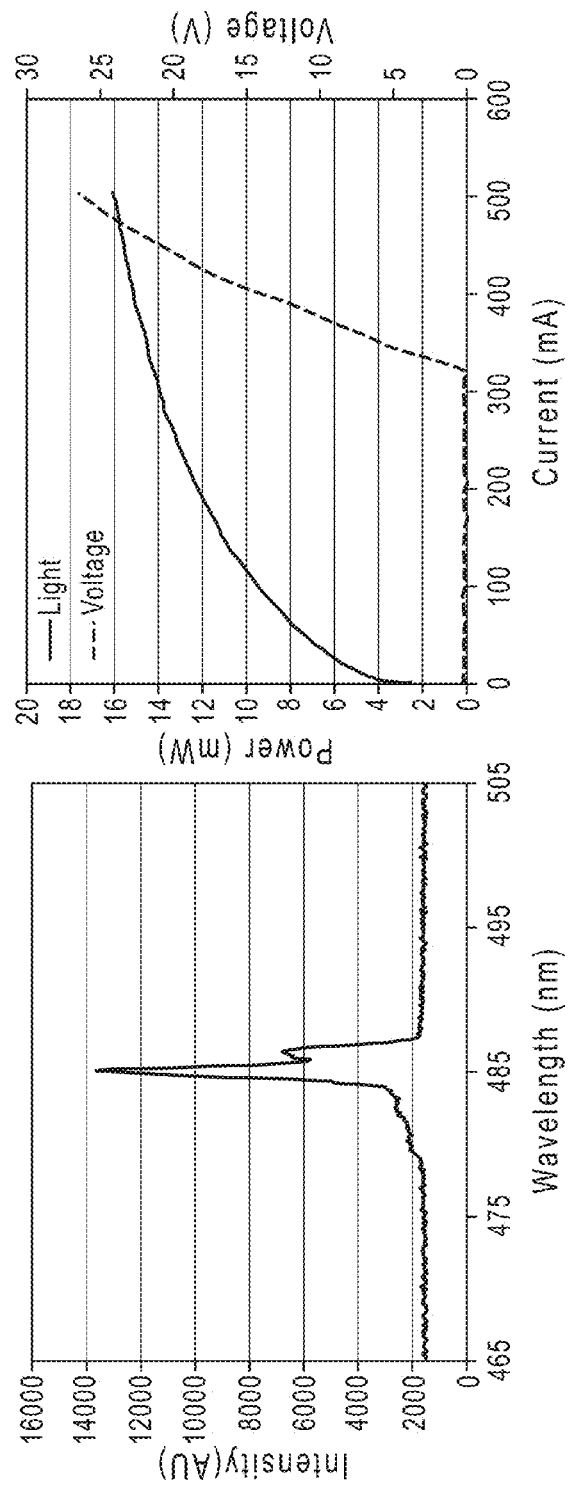
Figure 9:
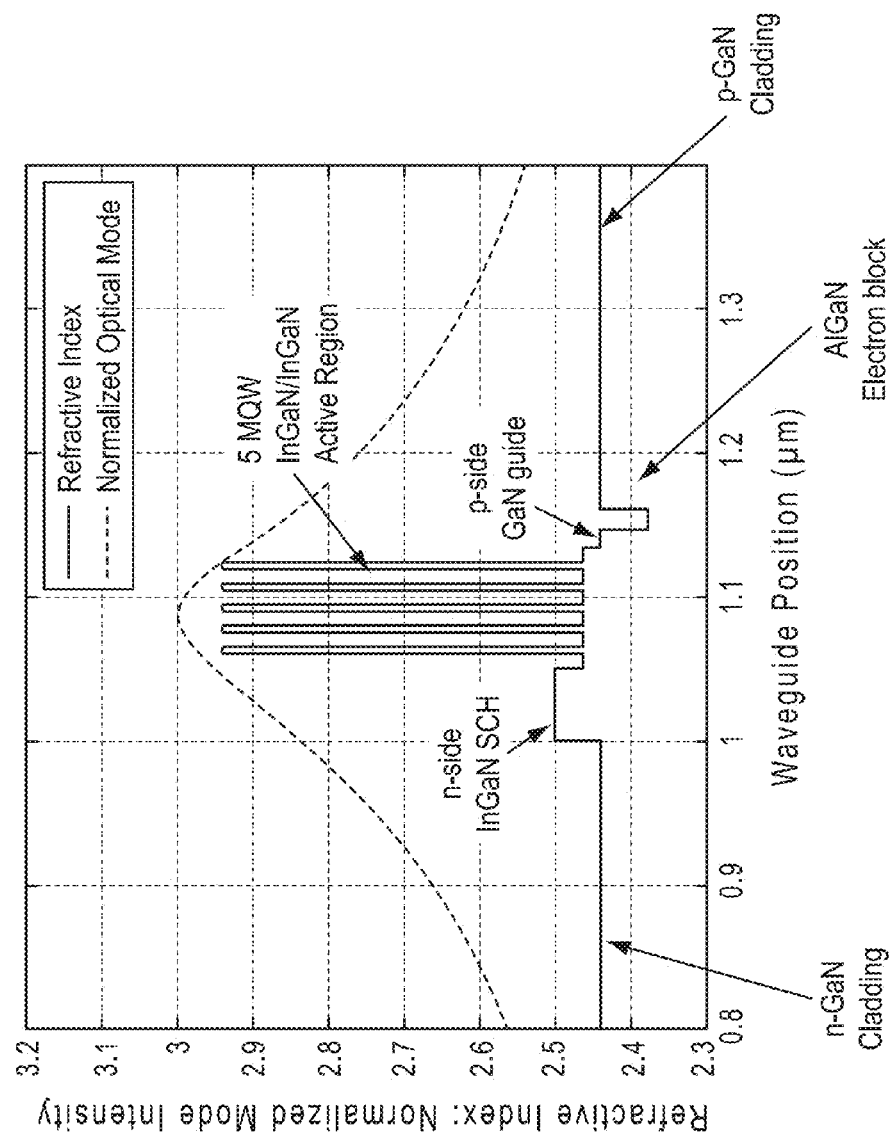
FIGS. 9 through 10 are simplified diagrams illustrating a laser device for a laser device according to a third embodiment of the present invention.

In yet an alternative specific embodiment, the present invention provides a laser device capable of emitting 486 nm wavelength light, among others, in a ridge laser embodiment. The device is provided with one or more of the following elements, as also referenced in FIGS. 8 through 9:

an n-GaN cladding layer with a thickness from 100 nm to 5000 nm with Si doping level of $5E17$ $cm^{-3}$ to $3E18$ $cm^{-3}$;

an n-side SCH layer comprised of InGaN with molar fraction of indium of between 3% and 5% and thickness from 40 to 60 nm;

a multiple quantum well active region layers comprised of seven 4.5-5.5 nm InGaN quantum wells separated by eight 4.5-5.5 nm GaN barriers;

a p-side guide layer comprised of GaN with a thickness from 40 nm to 50 nm;

an electron blocking layer comprised of AlGaN with molar fraction of aluminum of between 15% and 22% and thickness from 10 nm to 15 nm and doped with Mg;

a p-GaN cladding layer with a thickness from 400 nm to 1000 nm with Mg doping level of $5E17$ $cm^{-3}$ to $1E19$ $cm^{-3}$; and p++-GaN contact layer with a thickness from 20 nm to 40 nm with Mg doping level of $2E19$ $cm^{-3}$ to $1E21$ $cm^{-3}$.

In a specific embodiment, the laser device is fabricated on a non-polar (10-10) oriented surface region (m-plane). In a preferred embodiment, the non-polar substrate has a miscut or off cut of −0.8 to −1.2 degrees towards (0001) and −0.3 to 0.3 degrees towards (11-20). In a specific embodiment, the non-polar oriented surface region has an overlying n-GaN/p-GaN grown with $H_2/N_2$ subflow and $H_2$ carrier gas.

Figure 10:
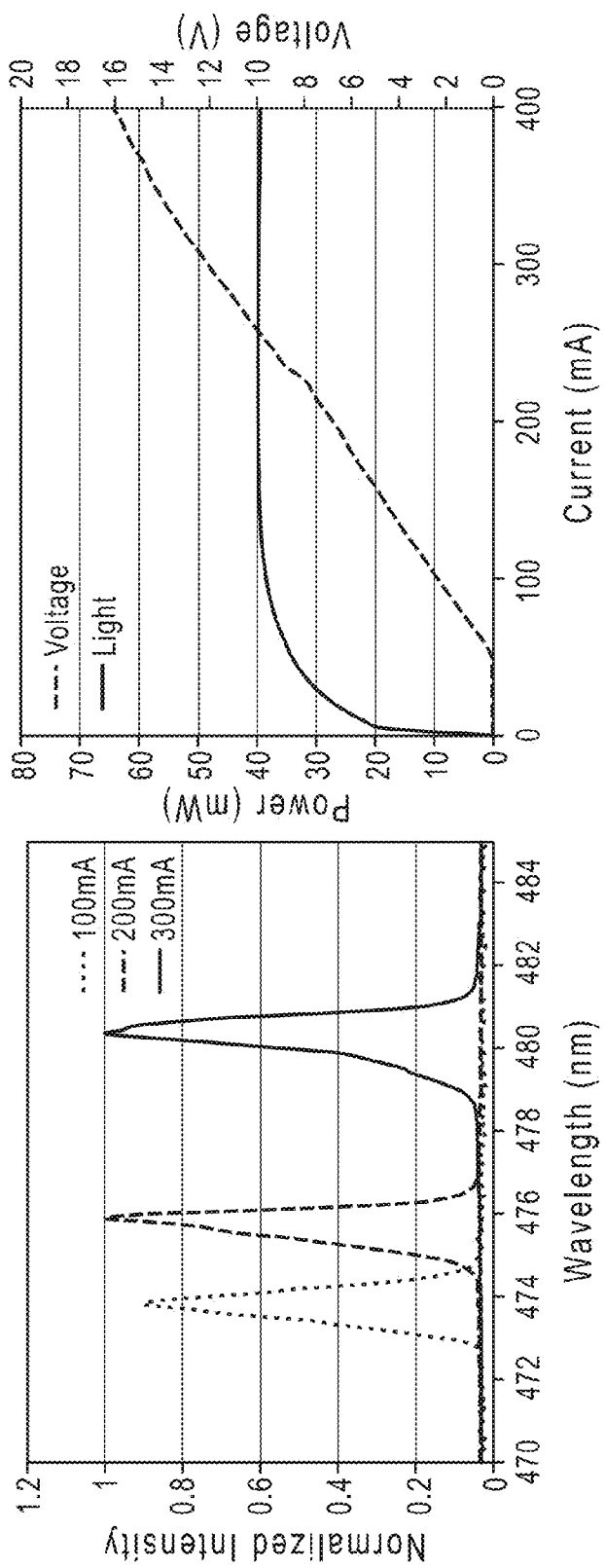

In a specific embodiment, the present invention provides an alternative device structure capable of emitting 481 nm light, among others, in a ridge laser embodiment. The device is provided with one or more of the following elements, as also referenced in FIGS. 9 through 10;

an n-GaN cladding layer with a thickness from 100 nm to 3000 nm with Si doping level of $5E17$ $cm^{-3}$ to $3E18$ $cm^{-3}$;

an n-side SCH layer comprised of InGaN with molar fraction of indium of between 3% and 6% and thickness from 45 to 80 nm;

a multiple quantum well active region layers comprised of five 4.5-5.5 nm InGaN quantum wells separated by four 9.5 nm to 10.5 nm InGaN barriers with an indium molar fraction of between 1.5% and 3%;

a p-side guide layer comprised of GaN with molar a thickness from 10 nm to 20 nm;

an electron blocking layer comprised of AlGaN with molar fraction of aluminum of between 6% and 22% and thickness from 10 nm to 15 nm and doped with Mg.

a p-GaN cladding layer with a thickness from 400 nm to 1000 nm with Mg doping level of $2E17$ $cm^{-3}$ to $4E19$ $cm^{-3}$; and a p++-GaN contact layer with a thickness from 20 nm to 40 nm with Mg doping level of $5E19$ $cm^{-3}$ to $1E21$ $cm^{-3}$.

In a specific embodiment, the laser device is fabricated on a non-polar oriented surface region (m-plane). In a preferred embodiment, the non-polar substrate has a miscut or off cut of −0.8 to −1.2 degrees towards (0001) and −0.3 to 0.3 degrees towards (11-20). In a specific embodiment, the non-polar oriented surface region has an overlying n-GaN/p-GaN grown with $H_2/N_2$ subflow and $H_2$ carrier gas.

Figure 11:
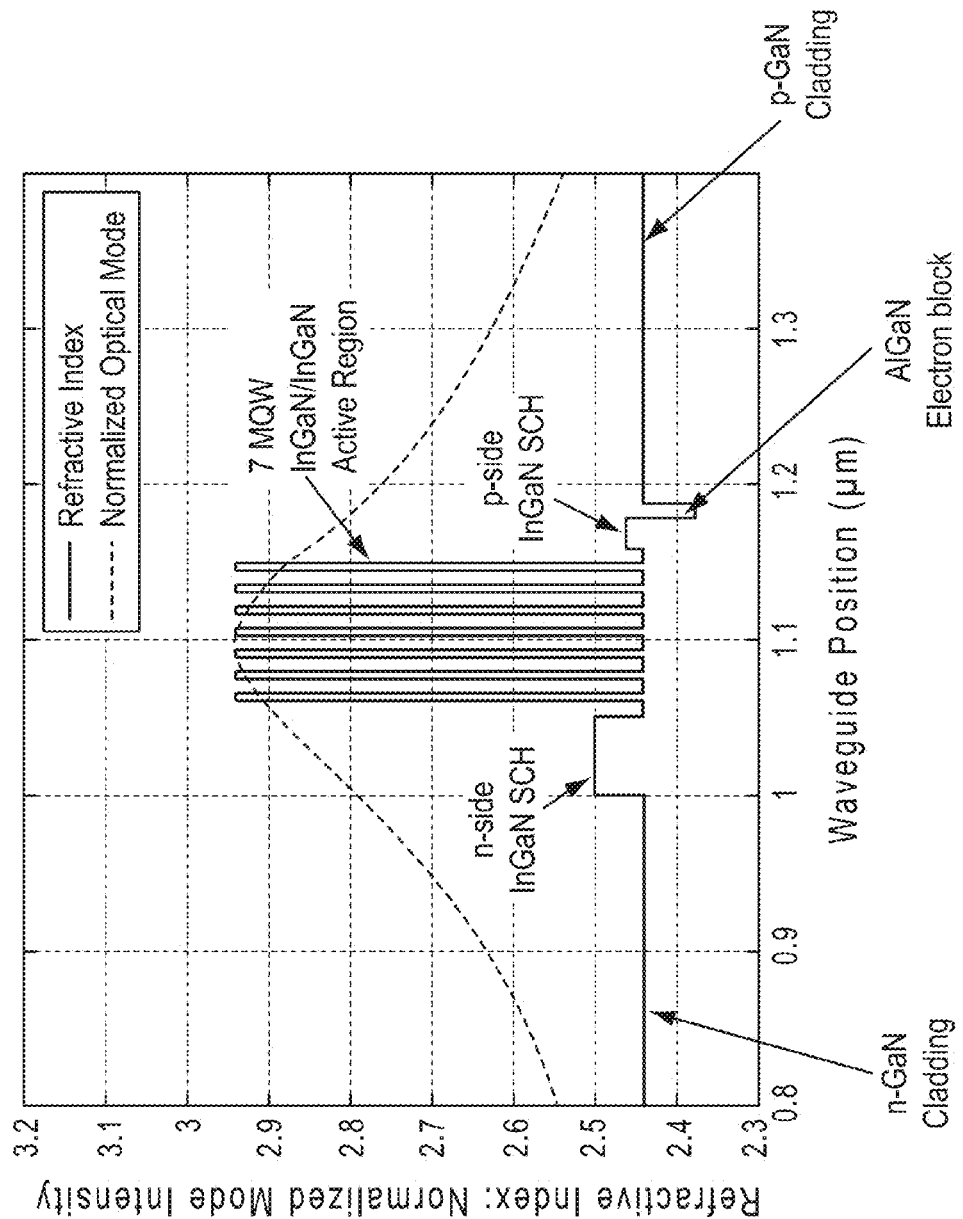
FIGS. 11 through 13 are simplified diagrams illustrating a laser device for a laser device according to a fourth embodiment of the present invention.
Figure 12:
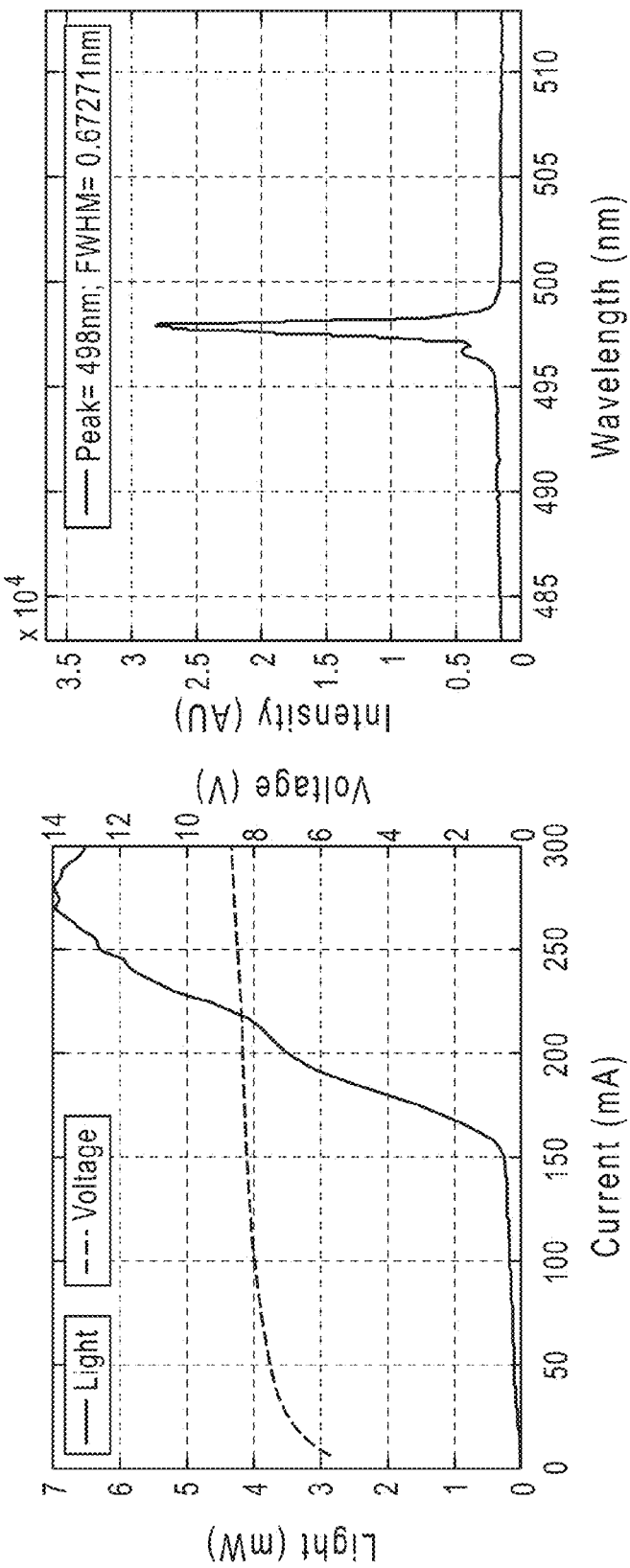
Figure 13:
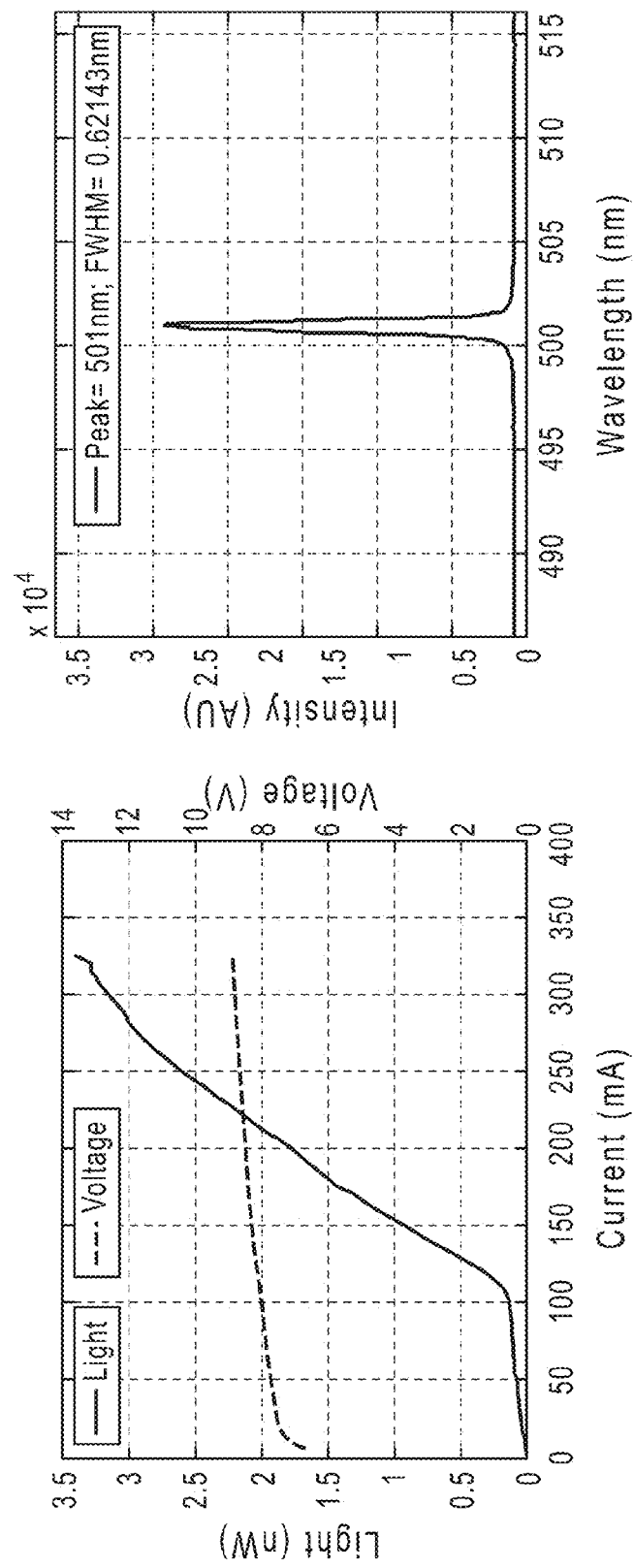

In a specific embodiment, the present invention provides an alternative device structure capable of emitting 501 nm light in a ridge laser embodiment. The device is provided with one or more of the following elements, as also referenced in FIGS. 11 through 13:

an n-GaN cladding layer with a thickness from 100 nm to 3000 nm with Si doping level of $5E17$ to $3E18$ $cm^{-3}$;

an n-side SCH layer comprised of InGaN with molar fraction of indium of between 3% and 7% and thickness from 40 to 60 nm;

a multiple quantum well active region layers comprised of seven 3.5-4.5 nm InGaN quantum wells separated by eight 9.5 nm to 10.5 nm GaN barriers;

a p-side SCH layer comprised of InGaN with molar a fraction of indium of between 2% and 5% and a thickness from 15 nm to 25 nm;

an electron blocking layer comprised of AlGaN with molar fraction of aluminum of between 8% and 22% and thickness from 10 nm to 15 nm and doped with Mg;

a p-GaN cladding layer with a thickness from 400 nm to 1000 nm with Mg doping level of $5E17$ $cm^{-3}$ to $1E19$ $cm^{-3}$; and a p++-GaN contact layer with a thickness from 20 nm to 40 nm with Mg doping level of $1E20$ $cm^{-3}$ to $1E21$ $cm^{-3}$.

In a specific embodiment, the laser device is fabricated on a non-polar (10-10) oriented surface region (m-plane). In a preferred embodiment, the non-polar substrate has a miscut or off cut of −0.8 to −1.2 degrees towards (0001) and −0.3 to 0.3 degrees towards (11-20). In a specific embodiment, the non-polar oriented surface region has an overlying n-GaN/p-GaN grown with $H_2/N_2$ subflow and $H_2$ carrier gas. In a preferred embodiment, the laser device configured for a 500 nm laser uses well regions and barriers fabricated using slow growth rates of between 0.3 and 0.6 angstroms per second, but can be others. In a specific embodiment, the slow growth rate is believed to maintain the quality of the InGaN at longer wavelengths.

In a specific embodiment, the present invention includes the following device structure.

An optical device comprising:

a gallium nitride substrate member having a semipolar crystalline surface region, the substrate member having a thickness of less than 500 microns, the gallium and nitride substrate member characterized by a dislocation density of less than $107$ $cm^{-2}$;

a semipolar surface region having a root mean square surface roughness of 10 nm and less over a 5 micron by 5 micron analysis area;

an offcut characterizing the surface region;

a gallium and nitrogen containing n-type cladding layer overlying the surface region, the n-type cladding layer having a thickness from 300 nm to 6000 nm with an n-type doping level of $1E17$ $cm^{-3}$ to $3E18$ $cm^{-3}$;

an n-side separate confining heterostructure (SCH) waveguiding layer overlying the n-type cladding layer, the n-side SCH waveguide layer comprising at least gallium, indium, and nitrogen with a molar fraction of InN of between 1% and 8% and having a thickness from 20 nm to 150 nm;

a multiple quantum well active region overlying the n-side SCH waveguide layer, the multiple quantum well active region comprising two to five 2.0 nm to 4.5 nm InGaN quantum wells separated by 3.5 nm to 20 nm gallium and nitrogen containing barrier layers;

a p-side guide layer overlying the multiple quantum well active region, the p-side guide layer comprising GaN or InGaN with a molar fraction of InN of between 1% and 8% and having a thickness from 10 nm to 120 nm;

a p-type gallium and nitrogen containing cladding layer overlying the multiple quantum well active region, the p-type cladding layer having a thickness from 300 nm to 1000 nm with a p-type doping level of $1E17$ $cm^{-3}$ to $5E19$ $cm^{-3}$;

a p++ gallium and nitrogen containing contact layer overlying the p-type cladding layer, the p++ gallium and nitrogen containing contact layer having a thickness from 10 nm to 120 nm with a p-type doping level of $1E19$ $cm^{-3}$ to $1E22$ $cm^{-3}$;

a waveguide member, the waveguide member being aligned substantially in a projection of the c-direction, the waveguide region comprising a first end and a second end;

a first facet formed on the first end; and a second facet formed on the second end.

Depending upon the embodiment, the present device structure can be made according to the steps outlined below.

In a specific embodiment, the present invention also includes the following device structure, and its variations in an optical device, and in particular a laser device. In this example, the optical device includes one more of the following elements:

a gallium nitride substrate member having a semipolar crystalline surface region, the substrate member having a thickness of less than 500 microns, the gallium and nitride substrate member characterized by a dislocation density of less than $10^7$ cm$^{-2}$;

a semipolar surface region having an root mean square surface roughness of 10 nm and less over a 5 micron by 5 micron analysis area;

an offcut characterizing the surface region;

a surface reconstruction region configured overlying the semipolar surface region and the n-type cladding layer and at an interface within a vicinity of the semipolar surface region, the surface reconstruction region having an oxygen bearing concentration of greater than 1E17 cm$^{-3}$;

an n-type cladding layer comprising a first quaternary alloy, the first quaternary alloy comprising an aluminum bearing species, an indium bearing species, a gallium bearing species, and a nitrogen bearing species overlying the surface region, the n-type cladding layer having a thickness from 100 nm to 5000 nm with an n-type doping level of 1E17 cm$^{-3}$ to 6E18 cm$^{-3}$;

a first gallium and nitrogen containing epitaxial material comprising a first portion characterized by a first indium concentration, a second portion characterized by a second indium concentration, and a third portion characterized by a third indium concentration overlying the n-type cladding layer;

an n-side separate confining heterostructure (SCH) waveguiding layer overlying the n-type cladding layer, the n-side SCH waveguide layer comprised of InGaN with molar fraction of InN of between 1% and 8% and having a thickness from 30 nm to 150 nm;

a multiple quantum well active region overlying the n-side SCH waveguide layer, the multiple quantum well active region comprising two to five 2.0 nm to 4.5 nm InGaN quantum wells separated by 5 nm to 20 nm gallium and nitrogen containing barrier layers;

a p-side guide layer overlying the multiple quantum well active region, the p-side guide layer comprising GaN or InGaN with a molar fraction of InN of between 1% and 5% and having a thickness from 20 nm to 100 nm;

a second gallium and nitrogen containing material overlying the p-side guide layer;

a p-type cladding layer comprising a second quaternary alloy overlying the second gallium and nitrogen containing material, the p-type cladding layer having a thickness from 300 nm to 1000 nm with a magnesium doping level of 1E17 cm$^{-3}$ to 4E19 cm$^{-3}$; a plurality of hydrogen species, the plurality of hydrogen species spatially disposed within the p-type cladding layer;

a p++ gallium and nitrogen containing contact layer overlying the p-type cladding layer, the p++ gallium and nitrogen containing contact layer having a thickness from 10 nm to 140 nm with a magnesium doping level of 1E19 cm$^{-3}$ to 1E22 cm$^{-3}$; and a waveguide member, the waveguide member being aligned substantially in a projection of the c-direction, the waveguide region comprising a first end and a second end;

a first facet formed on the first end;

a first semipolar characteristic configured on the first facet;

a second facet formed on the second end;

a second semipolar characteristic configured on the second facet;

a first edge region formed on a first side of the waveguide member;

a first etched surface formed on the first edge region;

a second edge region formed on a second side of the waveguide member; and a second etched surface formed on the second edge region.

In this example, the waveguide member is provided between the first facet and the second facet, e.g., semipolar facets having a scribe region and cleave region. In this example, the scribe region is less than thirty percent of the cleave region to help facilitate a clean break via a skip scribing techniques where the skip is within a vicinity of the ridge. The waveguide member has a length of greater than 300 microns and is configured to emit substantially polarized electromagnetic radiation such that a polarization is substantially orthogonal to the waveguide cavity direction and the polarized electromagnetic radiation having a wavelength of 500 nm and greater and a spontaneous emission spectral full width at half maximum of less than 50 nm in a light emitting diode mode of operation or a spectral line-width of a laser output of greater than 0.4 nm. The wavelength is preferably 520 nm and greater. The wall plug efficiency is 5 percent and greater. Depending upon the embodiment, the present device structure can be made according to the steps outlined below.

In this example, the present method includes providing a gallium nitride substrate member having a semipolar crystalline surface region. The substrate member has a thickness of less than 500 microns, which has been thinned to less than 100 microns by way of a thinning process, e.g., grinding polishing. The gallium and nitride substrate member is characterized by a dislocation density of less than $10^7$ cm$^{-2}$. The semipolar surface region is characterized by an off-set of +/−3 degrees from a (20-21) semipolar plane toward a c-plane. As an example, the gallium nitride substrate can be made using bulk growth techniques such as ammonothermal based growth or HVPE growth with extremely high quality seeds to reduce the dislocation density to below 1E5 cm$^{-2}$, below 1E3 cm$^{-2}$, or eventually even below 1E1 cm$^{-2}$.

In this example, the method also includes forming the surface reconstruction region overlying the semipolar surface region. The reconstruction region is formed by heating the substrate in the growth reactor to above 1000° C. with an ammonia (e.g., $NH_3$) and hydrogen (e.g., $H_2$) over pressure, e.g., atmospheric. The heating process flattens and removes micro-scratches and other imperfections on the substrate surface that lead to detrimental device performance. The micro-scratches and other imperfections are often caused by substrate preparation, including grinding, lapping, and polishing, among others.

In this example, the present method also forms an n-type cladding layer by introducing gaseous species of at least ammonia with nitrogen or hydrogen and an n-type dopant bearing species. The n-type cladding layer comprises silicon as the n-type dopant. The method also includes forming of the first gallium and nitrogen containing epitaxial material comprises n-type GaN and underlies the n-type quaternary cladding. The cladding layer includes aluminum, indium, gallium, and nitrogen in a wurtzite-crystalline structure. Preferably, the quaternary cladding region facilitates substantial lattice matching to the primary lattice constant of the substrate to achieve an increased aluminum content and a lower index cladding region. The lower index cladding layer enables better confine optical confinement within the active region leading to improved efficiency and gain within the laser device. The cladding layer is made with sufficient thickness to facilitate optical confinement, among other features.

The method includes forming the n-side separate confining heterostructure (SCH) waveguiding layer comprises processing at a deposition rate of less than 1.5 angstroms per second and an oxygen concentration of less than 8E17 cm$^{-3}$. In this example, the n-side SCH is an InGaN material having a thickness and an oxygen concentration. The oxygen concentration is preferably below a predetermined level within a vicinity of the multiple quantum well regions to prevent any detrimental influences therein. Further details of the multiple quantum well region are provided below.

In this example, the method includes forming the multiple quantum well active region by processing at a deposition rate of less than 1 angstroms per second and an oxygen concentration of less than 8E17 cm$^{-3}$. The method also includes forming the p-side guide layer overlying the multiple quantum well active region by depositing an InGaN SCH layer with an InN molar fraction of between 1% and 5% and a thickness ranging from 10 nm to 100 nm. The method forms the second gallium and nitrogen-containing material overlying the p-side guide layer by a process comprising a p-type GaN guide layer with a thickness ranging from 50 nm to 300 nm. As an example, the quantum well region can include two to four well regions, among others. Each of the quantum well layers is substantially similar to each other for improved device performance, or may be different.

In this example, the method includes forming an electron blocking layer overlying the p-side guide layer, the electron blocking layer comprising AlGaN with a molar fraction of AlN of between 6% and 22% and having a thickness from 5 nm to 25 nm and doped with a p-type dopant such as magnesium. The method includes forming the p-type cladding layer comprising a hydrogen species that has a concentration that tracks relatively with the p-type dopant concentration. The method includes forming a p++-gallium and nitrogen containing contact layer comprising a GaN material formed with a growth rate of less than 2.5 angstroms per second and characterized by a magnesium concentration of greater than 5E19 cm$^{-3}$. Preferably, the electron-blocking layer redirects electrons from the active region back into the active region for radiative recombination.

In this example, the present method includes an etching process for forming the waveguide member. The etching process includes using a dry etch technique such as inductively coupled plasma etching or reactive ion etching to etch to a depth that does not penetrate through the quantum well region to maintain the multiple quantum well active region substantially free from damage. In this example, the etching process may be timed or maintained to stop the etching before any damage occurs to the multiple quantum well region. The method includes forming the first facet on the first end and forming the second facet on the second end comprising a scribing and breaking process.

In this example, the present method is generally performed in a MOCVD process. The MOCVD process preferably includes; (1) cleaning (via removal of quartz ware, vacuum, and other cleaning process); (2) subjecting the MOCVD chamber into a plurality of growth species; and (3) removing an impurity to a predetermined level. In this example, the impurity may be an oxygen bearing impurity, among others. In a specific example, the present method is performed using an atmospheric MOCVD tool configured to deposit epitaxial materials at atmospheric pressure, e.g., 700 Torr to 900 Torr.

While the above has been a full description of the specific embodiments, various modifications, alternative constructions and equivalents can be used. Therefore, the above description and illustrations should not be taken as limiting the scope of the present invention which is defined by the appended claims.

What is claimed is:

1. A method for manufacturing an optical device, the method comprising:

providing a gallium and nitrogen containing substrate member having a semipolar crystalline surface region, the gallium and nitrogen containing substrate member having a thickness of less than 500 microns, the gallium and nitrogen containing substrate member characterized by a dislocation density of less than 10$^7$ cm$^{-2}$, the semipolar crystalline surface region having a root mean square surface roughness of 10 nm or less over a 5 micron by 5 micron analysis area, the semipolar crystalline surface region being characterized by a specified off-set from a (20-21) semipolar plane;

forming a surface reconstruction region overlying the semipolar crystalline surface region, the surface reconstruction region having an oxygen bearing concentration of greater than 1E17 cm$^{-3}$;

forming an n-type cladding layer comprising a first quaternary alloy, the first quaternary alloy comprising an aluminum bearing species, an indium bearing species, a gallium bearing species, and a nitrogen bearing species overlying the semipolar crystalline surface region, the n-type cladding layer having a thickness from 100 nm to 4000 nm with an n-type doping level of 1E17 cm$^{-3}$ to 6E18 cm$^{-3}$;

forming a first gallium and nitrogen containing epitaxial material comprising a first portion characterized by a first indium concentration, a second portion characterized by a second indium concentration, and a third portion characterized by a third indium concentration overlying the n-type cladding layer;

forming an n-side separate confining heterostructure (SCH) waveguiding layer overlying the n-type cladding layer, the n-side SCH waveguiding layer comprising InGaN with a molar fraction of InN of between 1% and 8% and having a thickness from 30 nm to 150 nm;

forming a multiple quantum well active region overlying the n-side SCH waveguiding layer, the multiple quantum well active region comprising two to five InGaN quantum wells having a thickness from 2.0 nm to 4.5 nm and being separated by gallium and nitrogen containing barrier layers having a thickness from 7.5 nm to 18 nm;

forming a p-side guide layer overlying the multiple quantum well active region, the p-side guide layer comprised of GaN or InGaN and having a thickness from 20 nm to 100 nm, the InGaN having a molar fraction of InN of between 1% and 5%;

forming a second gallium and nitrogen containing material overlying the p-side guide layer;

forming a p-type cladding layer comprising a second quaternary alloy overlying the second gallium and nitrogen containing material, the p-type cladding layer having a thickness from 300 nm to 1000 nm with a magnesium doping level of 1E17 cm$^{-3}$ to 3E19 cm$^{-3}$;

causing formation of a plurality of hydrogen species, the plurality of hydrogen species spatially disposed within the p-type cladding layer; and forming a p++ gallium and nitrogen containing contact layer overlying the p-type cladding layer, the p++ gallium and nitrogen containing contact layer having a thickness from 10 nm to 100 nm and a magnesium doping level of 2E19 cm$^{-3}$ to 1E22 cm$^{-3}$;

forming a waveguide member using an etching process, the waveguide member being aligned substantially in a projection of the c-direction, the waveguide member comprising a first end and a second end, the waveguide member having a first edge region formed on a first side of the waveguide member, the waveguide member having a second edge region formed on a second side of the waveguide member;

maintaining the etching process from causing any damage to the multiple quantum well active region;

forming a first facet on the first end, the first facet being characterized by a first semipolar characteristic; and forming a second facet on the second end, the second facet being characterized by a second semipolar characteristic;

whereupon the waveguide member is provided between the first facet and the second facet, the waveguide member having a length of greater than 300 microns and configured to emit substantially polarized electromagnetic radiation such that a polarization is substantially orthogonal to the waveguide member direction and the polarized electromagnetic radiation having a wavelength of 500 nm and greater and a spontaneous emission spectral full width at half maximum of less than 50 nm in a light emitting diode mode of operation.

2. The method of claim 1 wherein the semipolar crystalline surface region is characterized by an off-set of +/−3 degrees from the (20-21) semipolar plane toward a c-plane.

3. The method of claim 1 wherein the forming the surface reconstruction region overlying the semipolar crystalline surface region comprises heating the gallium and nitrogen containing substrate member to above 1000° C. with an ammonia and hydrogen over pressure.

4. The method of claim 1 wherein the forming the n-type cladding layer comprises introducing gaseous species of at least ammonia with nitrogen or hydrogen and an n-type dopant bearing species.

5. The method of claim 1 wherein the forming the n-type cladding layer comprises using silicon as the n-type dopant.

6. The method of claim 1 wherein the first gallium and nitrogen containing epitaxial material comprises n-type GaN and underlies the n-type cladding layer.

7. The method of claim 1 wherein the forming the n-side SCH waveguiding layer comprises processing at a deposition rate of less than 1.5 angstroms per second and an oxygen concentration of less than $8E17$ $cm^{-3}$.

8. The method of claim 1 wherein the forming the multiple quantum well active region comprises processing at a deposition rate of less than 1 angstroms per second and an oxygen concentration of less than $8E17$ $cm^{-3}$.

9. The method of claim 1 wherein the forming the p-side guide layer overlying the multiple quantum well active region comprises depositing an InGaN SCH layer with an InN molar fraction of between 1% and 5% and a thickness ranging from 10 nm to 100 nm.

10. The method of claim 1 wherein the forming the second gallium and nitrogen containing material overlying the p-side guide layer comprises depositing a p-type GaN guide layer with a thickness ranging from 50 nm to 300 nm.

11. The method of claim 1 further comprising an electron blocking layer overlying the p-side guide layer, the electron blocking layer comprising AlGaN with a molar fraction of AlN of between 6% and 22% and having a thickness from 5 nm to 25 nm and doped with a p-type dopant such as magnesium.

12. The method of claim 1 wherein the p-type cladding layer comprises a hydrogen species that has a concentration that tracks relatively with the p-type dopant concentration.

13. The method of claim 1 wherein the forming a p++-gallium and nitrogen containing contact layer comprises depositing a GaN material formed with a growth rate of less than 2.5 angstroms per second and characterized by a magnesium concentration of greater than $1E20$ $cm^{-3}$.

14. The method of claim 1 wherein the etching process for forming the waveguide member comprises using a dry etch technique to etch to a depth that does not penetrate through the multiple quantum well active region to maintain the multiple quantum well active region substantially free from damage.

15. The method of claim 1 wherein forming the first facet on the first end and forming the second facet on the second end comprises using a scribing and breaking process.

16. A method for fabricating a laser device, the method comprising:

providing a gallium and nitrogen containing substrate member having a semipolar crystalline surface region, the gallium and nitrogen containing substrate member having a thickness of less than 500 microns, the gallium and nitrogen containing substrate member characterized by a dislocation density of less than $10^7$ $cm^{-2}$, the semipolar crystalline surface region having a root mean square surface roughness over a 5 micron by 5 micron analysis area, the semipolar crystalline surface region being characterized by an offcut;

forming a gallium and nitrogen containing n-type cladding layer overlying the semipolar crystalline surface region, the gallium and nitrogen containing n-type cladding layer having a thickness from 300 nm to 6000 nm with an n-type doping level of $1E17$ $cm^{-3}$ to $3E18$ $cm^{-3}$;

forming an n-side separate confining heterostructure (SCH) waveguide layer overlying the gallium and nitrogen containing n-type cladding layer, the n-side SCH waveguide layer comprised of at least gallium, indium, and nitrogen with molar fraction of InN of between 1% and 8% and having a thickness from 20 nm to 150 nm;

forming a multiple quantum well active region overlying the n-side SCH waveguide layer, the multiple quantum well active region comprising two to five InGaN quantum wells having a thickness from 2.0 nm to 4.5 nm and being separated by gallium and nitrogen containing barrier layers;

forming a p-side guide layer overlying the multiple quantum well active region, the p-side guide layer comprised of GaN or InGaN and having a thickness from 10 nm to 120 nm;

forming a p-type gallium and nitrogen containing cladding layer overlying the multiple quantum well active region, the p-type gallium and nitrogen containing cladding layer having a thickness from 300 nm to 1000 nm with a p-type doping level of $1E17$ $cm^{-3}$ to $5E19$ $cm^{-3}$;

forming a p++ gallium and nitrogen containing contact layer overlying the p-type gallium and nitrogen containing cladding layer, the p++ gallium and nitrogen containing contact layer having a thickness from 10 nm to 120 nm with a p-type doping level of $1E19$ $cm^{-3}$ to $1E22$ $cm^{-3}$;

forming a waveguide member, the waveguide member being aligned substantially in a projection of the c-direction, the waveguide member comprising a first end and a second end;

forming a first facet formed on the first end; and forming a second facet formed on the second end.

17. The method of claim 16 wherein the gallium and nitrogen containing n-type cladding layer comprises n-type AlGaN.

18. The method of claim 16 wherein the gallium and nitrogen containing n-type cladding layer comprises n-type InAlGaN.

19. The method of claim 16 wherein the p-type gallium and nitrogen containing cladding layer comprises p-type AlGaN.

20. The method of claim 16 wherein the p-type gallium and nitrogen containing cladding layer comprises p-type InAlGaN.

21. The method of claim 16 wherein the gallium and nitrogen containing barrier layers comprise GaN and/or AlGaN.

22. The method of claim 16 wherein the first facet includes a semipolar characteristic.

23. The method of claim 16 wherein the second facet includes a semipolar characteristic.

24. The method of claim 16 wherein the semipolar crystalline surface region is characterized by an off-set of +/−3 degrees from a (20-21) semipolar plane toward a c-plane.

25. The method of claim 16 further comprising forming an electron blocking layer overlying the p-side guide layer, the electron blocking layer comprising AlGaN with a molar fraction of AlN of between 6% and 22% and having a thickness from 5 nm to 25 nm and doped with magnesium.

26. A method for manufacturing an optical device, the method comprising:
provided a gallium and nitrogen containing substrate member having a semipolar crystalline surface region, the gallium and nitrogen containing substrate member having a thickness of less than 450 microns, the gallium and nitrogen containing substrate member characterized by a dislocation density of less than $10^7$ cm$^{-2}$, the semipolar crystalline surface region having a root mean square surface roughness over a 5 micron by 5 micron analysis area;
forming an offcut characterizing the semipolar crystalline surface region;
forming an n-type cladding layer comprising at least an aluminum bearing species, a gallium bearing species, and a nitrogen bearing species overlying the semipolar crystalline surface region, the n-type cladding layer having a thickness from 100 nm to 5000 nm with an n-type doping level of 1E17 cm$^{-3}$ to 6E18 cm$^{-3}$;
forming a first gallium and nitrogen containing epitaxial material comprising a first portion including a first indium concentration, a second portion including a second indium concentration, and a third portion including a third indium concentration overlying the n-type cladding layer;
forming an n-side separate confining heterostructure (SCH) waveguide layer overlying the n-type cladding layer, the n-side SCH waveguide layer comprising InGaN with a molar fraction of InN of between 1% and 8% and having a thickness from 30 nm to 150 nm;
forming a multiple quantum well active region overlying the n-side SCH waveguide layer, the multiple quantum well active region comprising two to five InGaN quantum wells having a thickness from 2.0 nm to 4.5 nm and being separated by gallium and nitrogen containing barrier layers having a thickness from 5.5 nm to 18 nm;
forming a p-side guide layer overlying the multiple quantum well active region, the p-side guide layer comprised of GaN or InGaN and having a thickness from 20 nm to 100 nm;
forming a p-type cladding layer comprising at least an aluminum bearing species, a gallium bearing species, and a nitrogen bearing species overlying the p-side guide layer, the p-type cladding layer having a thickness from 250 nm to 1000 nm with a p-type doping level of 1E17 cm$^{-3}$ to 5E19 cm$^{-3}$;
forming a plurality of hydrogen species, the plurality of hydrogen species spatially disposed within the p-type cladding layer;
forming a p++ gallium and nitrogen containing contact layer overlying the p-type cladding layer, the p++ gallium and nitrogen containing contact layer having a thickness from 10 nm to 100 nm with a p-type doping level of 1E19 cm$^{-3}$ to 1E22 cm$^{-3}$;
forming a waveguide member, the waveguide member being aligned substantially in a projection of the c-direction, the waveguide member comprising a first end and a second end;
forming a first facet formed on the first end such that a first semipolar characteristic configured on the first facet;
forming a second facet formed on the second end such that a second semipolar characteristic configured on the second facet;
forming a first edge region formed on a first side of the waveguide member such that a first etched surface formed on the first edge region;
forming a second edge region formed on a second side of the waveguide member such that a second etched surface formed on the second edge region;
whereupon the waveguide member is provided between the first facet and the second facet, the waveguide member having a length of greater than 300 microns and configured to emit substantially polarized electromagnetic radiation such that a polarization is substantially orthogonal to a waveguide cavity direction and the substantially polarized electromagnetic radiation having a wavelength of 500 nm and greater and a spontaneous emission spectral full width at half maximum of less than 50 nm in a light emitting diode mode of operation.

27. The method of claim 26 wherein the n-type cladding layer comprises n-type AlGaN.

28. The method of claim 26 wherein the n-type cladding layer comprises n-type InAlGaN.

29. The method of claim 26 wherein the p-type cladding layer comprises p-type AlGaN.

30. The method of claim 26 wherein the p-type cladding layer comprises p-type InAlGaN.

31. The method of claim 26 wherein the gallium and nitrogen containing barrier layers comprise GaN and/or AlGaN.

32. The method of claim 26 wherein the semipolar crystalline surface region is characterized by an off-set of +/−3 degrees from a (20-21) semipolar plane toward a c-plane.

33. A method for fabricating an optical device comprising:
providing a gallium and nitrogen containing substrate member having a semipolar crystalline surface region, the gallium and nitrogen containing substrate member having a thickness of less than 500 microns, the gallium and nitrogen containing substrate member characterized by a dislocation density of less than $10^7$ cm$^2$, the semipolar crystalline surface region having a root mean square surface roughness of 10 nm or less over a 5 micron by 5 micron analysis area;
forming an offcut characterizing the semipolar crystalline surface region;
forming an n-type cladding layer comprising a first quaternary alloy, the first quaternary alloy comprising an aluminum bearing species, an indium bearing species, a gallium bearing species, and a nitrogen bearing species overlying the semipolar crystalline surface region, the n-type cladding layer having a thickness from 100 nm to 5000 nm with an n-type doping level of $1E17\ cm^{-3}$ to $6E18\ cm^{-3}$;

forming a surface reconstruction region overlying the semipolar crystalline surface region and the n-type cladding layer and at an interface within a vicinity of the semipolar crystalline surface region, the surface reconstruction region having an oxygen bearing concentration of greater than $1E17\ cm^{-3}$;

forming a first gallium and nitrogen containing material comprising a first portion including a first indium concentration, a second portion including a second indium concentration, and a third portion including a third indium concentration overlying the n-type cladding layer;

forming an n-side separate confining heterostructure (SCH) waveguide layer overlying the n-type cladding layer, the n-side SCH waveguide layer comprised of InGaN with molar fraction of InN of between 1% and 8% and having a thickness from 30 nm to 150 nm;

forming a multiple quantum well active region overlying the n-side SCH waveguide layer, the multiple quantum well active region comprising two to five InGaN quantum wells having a thickness from 2.0 nm to 4.5 nm and being separated by gallium and nitrogen containing barrier layers having a thickness from 5 nm to 20 nm;

forming a p-side guide layer overlying the multiple quantum well active region, the p-side guide layer comprising GaN or InGaN and having a thickness from 20 nm to 100 nm;

forming a second gallium and nitrogen containing material overlying the p-side guide layer;

forming a p-type cladding layer comprising a second quaternary alloy overlying the second gallium and nitrogen containing material, the p-type cladding layer having a thickness from 250 nm to 1000 nm and comprising a p-type doping species including magnesium at a concentration of $1E17\ cm^{-3}$ to $4E19\ cm^{-3}$;

forming a plurality of hydrogen species, the plurality of hydrogen species spatially disposed within the p-type cladding layer;

forming a p++ gallium and nitrogen containing contact layer overlying the p-type cladding layer, the p++ gallium and nitrogen containing contact layer having a thickness from 10 nm to 140 nm and comprising a p-type doping species including magnesium at a concentration of $1E19\ cm^{-3}$ to $1E22\ cm^{-3}$;

forming a waveguide member, the waveguide member being aligned substantially in a projection of the c-direction, the waveguide member comprising a first end and a second end;

whereupon a first facet formed on the first end, a first semipolar characteristic configured on the first facet, a second facet formed on the second end, a second semipolar characteristic configured on the second facet, a first edge region formed on a first side of the waveguide member, a first etched surface formed on the first edge region, a second edge region formed on a second side of the waveguide member, and a second etched surface formed on the second edge region; and whereupon the waveguide member is provided between the first facet and the second facet, the waveguide member having a length of greater than 300 microns and configured to emit substantially polarized electromagnetic radiation such that a polarization is substantially orthogonal to a waveguide cavity direction and the substantially polarized electromagnetic radiation having a wavelength of 500 nm and greater and a spontaneous emission spectral full width at half maximum of less than 50 nm in a light emitting diode mode of operation or a spectral line-width of a laser output of greater than 0.4 nm.

* * * * *